US012563775B2

(12) United States Patent
Lee et al.

(10) Patent No.: US 12,563,775 B2
(45) Date of Patent: Feb. 24, 2026

(54) TRANSISTOR DEVICES HAVING BURIED INTERCONNECTION LINE BELOW SOURCE/DRAIN REGIONS AND ONE OR MORE PROTECTIVE LAYERS COVERING LOWER SURFACES OF GATE STRUCTURES

(71) Applicant: SAMSUNG ELECTRONICS CO., LTD., Suwon-si (KR)

(72) Inventors: Doohyun Lee, Hwaseong-si (KR); Heonjong Shin, Yongin-si (KR); Seonbae Kim, Hwaseong-si (KR); Jinyoung Park, Hwaseong-si (KR); Hyunho Park, Suwon-si (KR); Jimin Yu, Suwon-si (KR); Jaeran Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 554 days.

(21) Appl. No.: 18/073,682

(22) Filed: Dec. 2, 2022

(65) Prior Publication Data

US 2023/0223451 A1    Jul. 13, 2023

(30) Foreign Application Priority Data

Jan. 11, 2022    (KR) ........................ 10-2022-0004150

(51) Int. Cl.
*H10D 30/67*      (2025.01)
*H01L 23/528*    (2006.01)
*H10D 62/10*      (2025.01)

(52) U.S. Cl.
CPC ..... *H10D 30/6729* (2025.01); *H01L 23/5286* (2013.01); *H10D 30/6735* (2025.01); *H10D 62/121* (2025.01)

(58) Field of Classification Search
CPC ............ H10D 30/6735; H10D 30/797; H10D 30/6757; H10D 30/6729; H10D 30/0198; H01L 23/5286
See application file for complete search history.

(56) References Cited

U.S. PATENT DOCUMENTS

| 10,685,865 | B2 | 6/2020 | Sung et al. |
| 11,101,217 | B2 | 8/2021 | Xie et al. |
| 2017/0062421 | A1 | 3/2017 | Cosemans et al. |
(Continued)

FOREIGN PATENT DOCUMENTS

| CN | 113380886 A | 9/2021 |
| CN | 113488465 A | 10/2021 |
(Continued)

*Primary Examiner* — Changhyun Yi
(74) *Attorney, Agent, or Firm* — Muir Patent Law, PLLC

(57) ABSTRACT

A semiconductor device includes an active region extending in a first direction; a device isolation layer on side surfaces of the active region and defining the active region; a gate structure intersecting the active region on the active region and extending in a second direction; source/drain regions in regions in which the active region is recessed, on both sides of the gate structure; first protective layers between the device isolation layer and the gate structure; and a buried interconnection line below the source/drain regions and connected to one of the source/drain regions through an upper surface of the buried interconnection line.

20 Claims, 20 Drawing Sheets

100

(56)                    References Cited

U.S. PATENT DOCUMENTS

| | | | |
|---|---|---|---|
| 2020/0135634 | A1 | 4/2020 | Chiang et al. |
| 2021/0028059 | A1 | 1/2021 | Chan et al. |
| 2021/0134721 | A1 | 5/2021 | Chiang et al. |
| 2021/0305381 | A1 | 9/2021 | Chiang et al. |
| 2021/0376093 | A1 | 12/2021 | Chu et al. |
| 2021/0399099 | A1 | 12/2021 | Chu et al. |
| 2022/0352352 | A1* | 11/2022 | Huang .............. H01L 21/76898 |

FOREIGN PATENT DOCUMENTS

| | | | |
|---|---|---|---|
| KR | 10-2020-0049468 | A | 5/2020 |
| KR | 1020200136519 | A | 12/2020 |
| KR | 1020210000780 | A | 1/2021 |

* cited by examiner

TRANSISTOR DEVICES HAVING BURIED INTERCONNECTION LINE BELOW SOURCE/DRAIN REGIONS AND ONE OR MORE PROTECTIVE LAYERS COVERING LOWER SURFACES OF GATE STRUCTURES

CROSS-REFERENCE TO RELATED APPLICATION(S)

This application claims benefit of priority to Korean Patent Application No. 10-2022-0004150, filed on Jan. 11, 2022, in the Korean Intellectual Property Office, the disclosure of which is incorporated herein by reference in its entirety.

BACKGROUND

1. Field

Embodiments relate to semiconductor devices.

2. Description of the Related Art

As demand for high performance, high speed, and/or multifunctionality of a semiconductor device increases, a degree of integration of the semiconductor device is increasing. In manufacturing a semiconductor device having a fine pattern corresponding to the trend for a high degree of integration of the semiconductor device, it is necessary to implement patterns having a fine width or a fine separation distance. In addition, in order to overcome limitations in operating characteristics due to a decrease in the size of planar metal oxide semiconductor FETs (MOSFETs), efforts are being made to develop a semiconductor device having a channel having a three-dimensional structure.

SUMMARY

According to some example embodiments, a semiconductor device includes an active region extending in a first direction; a device isolation layer on side surfaces of the active region and defining the active region; gate structures intersecting the active region on the active region and extending in a second direction; a plurality of channel layers on the active region to be spaced apart from each other in a third direction, perpendicular to an upper surface of the active region, and respectively surrounded by the gate structures; source/drain regions in regions in which the active region is recessed, on both sides of the gate structures, and connected to the plurality of channel layers; first protective layers on the device isolation layer and covering lower surfaces of the gate structures; second protective layers on the active region and below lowermost channel layers among the plurality of channel layers; and a buried interconnection line below the source/drain regions and connected to one of the source/drain regions between the second protective layers, adjacent in the first direction.

According to some example embodiments, a semiconductor device includes an active region extending in a first direction; a device isolation layer on side surfaces of the active region and defining the active region; a gate structure intersecting the active region on the active region and extending in a second direction; source/drain regions in regions in which the active region is recessed, on both sides of the gate structure; first protective layers between the device isolation layer and the gate structure; and a buried interconnection line below the source/drain regions and connected to one of the source/drain regions through an upper surface of the buried interconnection line.

According to some example embodiments, a semiconductor device includes an active region extending in a first direction; a device isolation layer on side surfaces of the active region and defining the active region; gate structures intersecting the active region on the active region, extending in a second direction, and spaced apart from each other in the first direction; source/drain regions in regions in which the active region is recessed, on both sides of the gate structures; protective layers between the device isolation layer and the gate structures; and a buried interconnection line below the source/drain regions, connected to one of the source/drain regions between the protective layers, adjacent in the first direction, and contacting at least one of the protective layers.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
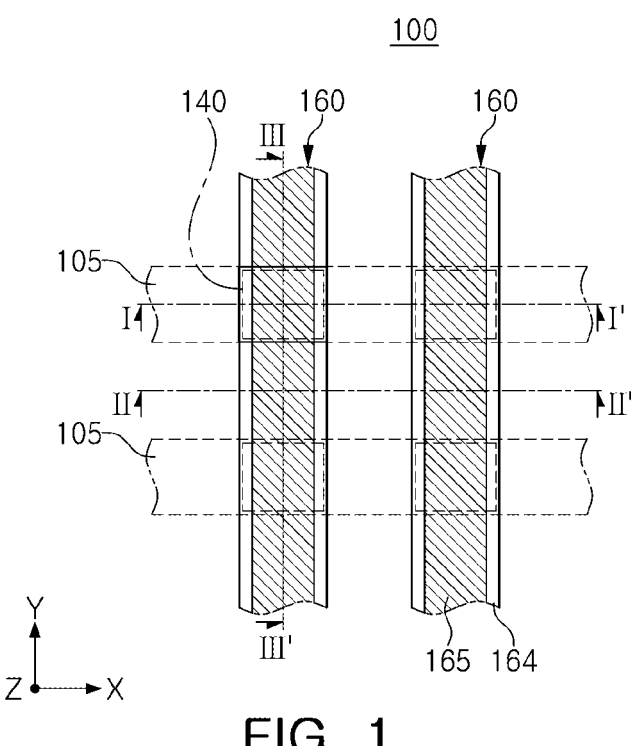
FIG. 1 is a plan view illustrating a semiconductor device according to example embodiments.

Hereinafter, embodiments will be described with reference to the accompanying drawings. Hereinafter, it can be understood that terms such as 'on,' 'upper,' 'an upper portion,' 'an upper surface,' 'below,' 'lower,' 'a lower portion,' 'a lower surface,' 'a side surface,' or the like may be denoted by reference numerals and refer to the drawings, except in which otherwise indicated.

Figure 2A:
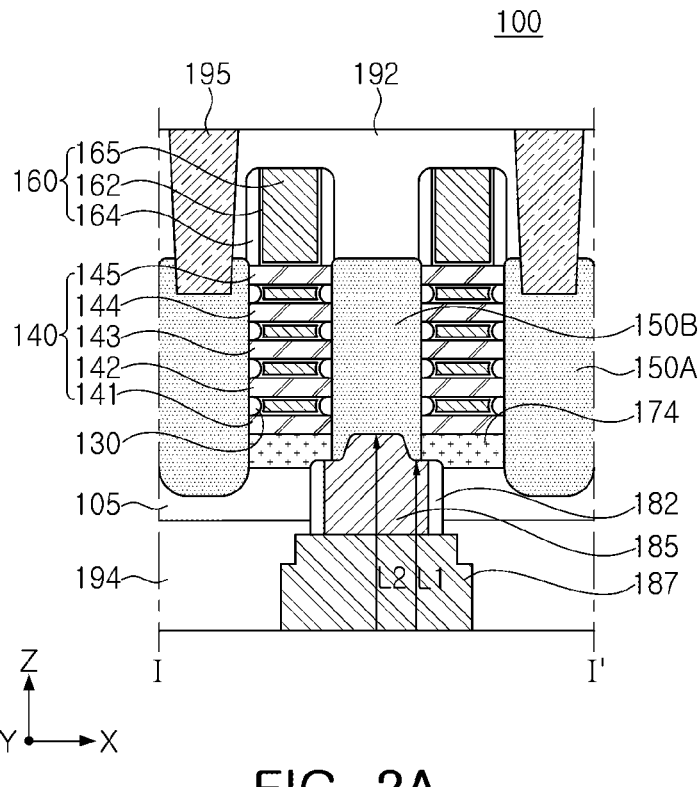
FIGS. 2A, 2B, and 2C are cross-sectional views illustrating a semiconductor device according to example embodiments.
Figure 2B:
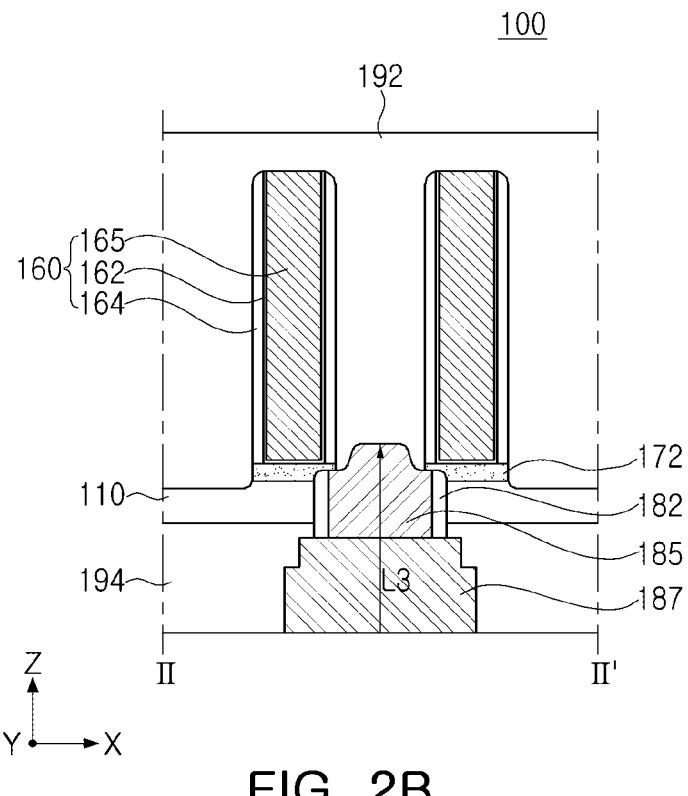
Figure 2C:
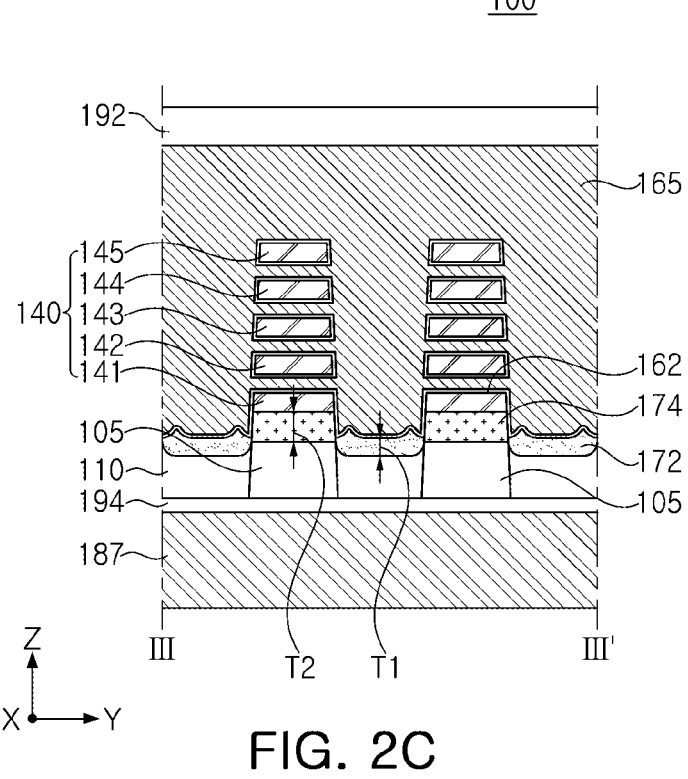

FIG. 1 is a plan view illustrating a semiconductor device according to example embodiments. FIGS. 2A to 2C are cross-sectional views of the semiconductor device of FIG. 1, taken along lines I-I', and respectively. For convenience of explanation, in FIG. 1, only some components of a semiconductor device are illustrated.

Referring to FIGS. 1 to 2C, a semiconductor device 100 may include active regions 105, a device isolation layer 110 defining the active regions 105, gate structures 160 intersecting the active regions 105 on the active regions 105, channel structures 140 including first to fifth channel layers 141, 142, 143, 144, and 145 disposed on the active regions 105 to be spaced apart from each other, first and second source/drain regions 150A and 150B disposed on both sides of the gate structures 160 to contact the channel structures 140, first protective layers 172 covering a portion of lower surfaces of the gate structures 160, second protective layers 174 disposed below lowermost surfaces of the channel structures 140, a buried interconnection line 185 connected to the second source/drain region 150B, and contact plugs 195 connected to the first source/drain regions 150A. The gate structure 160 may include gate dielectric layers 162, gate spacer layers 164, and a gate electrode 165. The semiconductor device 100 may further include inner spacer layers 130, interconnection spacer layers 182, a lower interconnection layer 187, and first and second interlayer insulating layers 192 and 194.

In the semiconductor device 100, the gate electrode 165 may be disposed between the first to fifth channel layers 141, 142, 143, 144, and 145 of the channel structures 140 and on the channel structures 140, e.g., portions of the gate electrode 165 may be disposed between adjacent ones of the first to fifth channel layers 141, 142, 143, 144, and 145 in the vertical direction (e.g., Z-direction.) Therefore, the semiconductor device 100 may include a transistor having a multi-bridge channel FET (MBCFET™) structure, which may be a gate-all-around field effect transistor.

The active regions 105 may be disposed to extend in a first direction, e.g., an X-direction, and may be disposed to be spaced apart from each other in a second direction, e.g., a Y-direction. The active regions 105 may be regions corresponding to a portion of a substrate on which the semiconductor device 100 is formed, and may be regions that remain without being removed during a process of manufacturing the semiconductor device 100. The substrate may be provided, e.g., as a bulk wafer, an epitaxial layer, a silicon on insulator (SOI) layer, a semiconductor on insulator (SeOI) layer, or the like. The active regions 105 may include a semiconductor material, e.g., a group IV semiconductor, a group III-V compound semiconductor, or a group II-VI compound semiconductor. For example, the group IV semiconductor may include silicon, germanium, or silicon-germanium. The active regions 105 may further include an impurity region that may be a doped region.

Below the gate structures 160, upper surfaces of the active regions 105 may be located at a higher level than an upper surface of the device isolation layer 110, and may protrude from, e.g., above, the device isolation layer 110 (FIG. 2C). On both sides of the gate structures 160, the active regions 105 may be partially recessed or penetrated. The first and second source/drain regions 150A and 150B may be disposed in regions in which the active regions 105 are recessed.

The device isolation layer 110 may be disposed to define the active regions 105 in the substrate. The device isolation layer 110 may be disposed on side surfaces of the active region 105 and outer side surfaces of the interconnection spacer layers 182. The device isolation layer 110 may fill a space between the active regions 105, and when the buried interconnection line 185 is provided as a plurality of buried interconnection lines 185, the device isolation layer 110 may fill a space between the buried interconnection lines 185. The device isolation layer 110 may be formed by, e.g., a shallow trench isolation (STI) process. The device isolation layer 110 may be formed of an insulating material, e.g., an oxide, a nitride, or a combination thereof.

The gate structures 160 may intersect the active regions 105 on the active regions 105 to extend in the Y-direction, and may be disposed to be spaced apart from each other in the X-direction. Channel regions of transistors may be formed in the channel structures 140 intersecting the gate electrode 165 of the gate structure 160. The gate structure 160 may include the gate electrode 165, the gate dielectric layer 162, and the gate spacer layers 164. For example, the gate structures 160 may further include a capping layer on the uppermost surface of the gate electrode 165. In another example, a portion of the first interlayer insulating layer 192 on the gate structures 160 may be referred to as a gate capping layer.

The gate dielectric layer 162 may be disposed between the channel structure 140 and the gate electrode 165, and may be disposed to cover at least a portion of, e.g., lateral, surfaces of the gate electrode 165. For example, the gate dielectric layer 162 may be disposed to surround all surfaces of the gate electrode 165 except an uppermost surface of the gate electrode 165. On the channel structure 140, the gate dielectric layer 162 may extend between the gate electrode 165 and each of the gate spacer layers 164. The gate dielectric layer 162 may include, e.g., an oxide, a nitride, or a high-κ material. The high-κ material may refer to a dielectric material having a higher dielectric constant than that of silicon oxide ($SiO_2$). The high-κ material may be, e.g., any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). In some embodiments, the gate dielectric layer 162 may be formed of multilayer structures.

The gate electrode 165 may include a conductive material. For example, the gate electrode 165 may include a metal nitride, e.g., titanium nitride (TiN), tantalum nitride (TaN), or tungsten nitride (WN), a metal material, e.g., aluminum (Al), tungsten (W), or molybdenum (Mo), and/or a semiconductor material, e.g., doped polysilicon. In some embodiments, the gate electrode 165 may be formed of two or more multilayer structures.

The gate spacer layers 164 may be disposed on both, e.g., opposite, sides of the gate electrode 165 on the channel structure 140. The gate spacer layers 164 may insulate the first and second source/drain regions 150A and 150B from the gate electrodes 165. According to embodiments, shapes of the gate spacer layers 164 may be variously changed, and the gate spacer layers 164 may have a multilayer structure. The gate spacer layers 164 may be formed of at least one of, e.g., an oxide, a nitride, an oxynitride, and/or a low-κ film.

The channel structures 140 may be formed on the active regions 105, in regions in which the active regions 105 intersect the gate structures 160. The channel structures 140 may include the first to fifth channel layers 141, 142, 143, 144, and 145, which may be two or more channel layers spaced apart from each other in the Z-direction. The channel structures 140 may be connected to the first and second source/drain regions 150A and 150B. The channel structures 140 may have a width that is equal to or narrower than a width of each of the active regions 105 in the Y-direction. The channel structures 140 may have a width that is equal or similar to a width of each of the gate structures 160 in the X-direction. For example, in a cross-section in the Y-direction, among the first to fifth channel layers 141, 142, 143, 144, and 145, a lower channel layer may have a width equal to or wider than a width of an upper channel layer e.g., the width of the channel structures 140 may gradually decrease in the Y direction as a distance from the active regions 105 increases (FIG. 2C). In some embodiments, the channel structures 140 may have a reduced width, e.g., a width smaller than that of the gate structure 160, such that side surfaces of the channel structures 140 may be located below the gate structures 160 in the X-direction.

Lower surfaces of the lowermost first channel layers 141 may not be surrounded by the gate dielectric layer 162. The lower surfaces of the first channel layers 141 may be in contact with the second protective layers 174. Therefore, regions including the lower surfaces of the first channel layers 141 may not substantially function as a channel region of a transistor. According to a description manner, the first channel layers 141 may be distinguished from the second to fifth channel layers 142, 143, 144, and 145, and may be referred to as a portion of the active region 105, or may also be separately referred to as a semiconductor layer.

The channel structures 140 may be formed of a semiconductor material, e.g., at least one of silicon (Si), silicon germanium (SiGe), or germanium (Ge). For example, the channel structures 140 may be formed of the same material as the active regions 105. In some embodiments, the channel structures 140 may include an impurity region located in a region adjacent to the first and second source/drain regions 150A and 150B. The number and shapes of the channel layers constituting one channel structure 140 may be variously changed in embodiments.

The first and second source/drain regions 150A and 150B may be arranged to contact the channel structures 140 on both sides of the gate structures 160, respectively. The second source/drain region 150B may be a source/drain region connected to the buried interconnection line 185 to receive power. The first source/drain regions 150A may be connected to the contact plugs 195, and may be spaced apart from the buried interconnection line 185.

The second source/drain region 150B may have a shape partially recessed from a lower surface of the second source/drain region 150B, and accordingly, lower ends of the first and second source/drain regions 150A and 150B may be located on different height levels, e.g., relative to a lower surface of the active region 105. Levels of the lower ends of the second source/drain regions 150B may be higher than levels of lower ends of the first source/drain regions 150A, e.g., relative to the lower surface of the active region 105. In example embodiments, a depth of the recessed lower surface of the second source/drain region 150B may be variously changed.

Upper surfaces of the first and second source/drain regions 150A and 150B may be located on the same or similar level to lower surfaces of the gate structures 160 on the channel structures 140, and levels of the upper surfaces of the first and second source/drain regions 150A and 150B may be variously changed in embodiments. A cross-section of each of the first and second source/drain regions 150A and 150B, outside the gate structures 160, in the Y-direction, may have a polygonal shape, or may have any other suitable shape, e.g., an elliptical shape or the like. The first and second source/drain regions 150A and 150B may include a semiconductor material, and may further include impurities.

The first protective layers 172 may be disposed on the device isolation layer 110 to cover the lower surfaces of the gate structures 160. As illustrated in FIG. 2B, the first protective layers 172 may be disposed, e.g., directly, between the gate structures 160 and the device isolation layer 110, e.g., the first protective layers 172 may completely separate between each of the gate structures 160 and the device isolation layer 110. The first protective layers 172 may be in, e.g., direct, contact with lower surfaces of the gate dielectric layers 162 and lower surfaces of the gate spacer layers 164, and may be disposed below the gate dielectric layers 162 and the gate spacer layers 164. A width of each of the first protective layers 172 in the X-direction may be substantially equal to or wider than a width of the gate structure 160 in the X-direction. In some embodiments, the first protective layers 172 may partially remain on the device isolation layer 110 outside the gate structures 160. The first protective layers 172 may be in, e.g., direct, contact with the interconnection spacer layers 182 and the buried interconnection line 185 in at least one region.

As illustrated in FIG. 2C, the first protective layers 172 may be alternately arranged with a stack structure of the first channel layer 141 and the second protective layers 174 on a lower surface of the gate structure 160 in the Y-direction. The first protective layers 172 may be disposed in regions between active regions 105 adjacent in the Y-direction. Both end portions of the first protective layers 172 in the Y-direction may be located on the device isolation layer 110. Both end portions of the first protective layers 172 in the Y-direction may be in, e.g., direct, contact with the second protective layers 174 and the active regions 105. The first protective layers 172 may overlap the device isolation layer 110 and the gate structures 160 in the Z-direction (e.g., in a top view), and may entirely overlap the device isolation layer 110 and the gate structures 160, e.g., the gate structures 160 may cover entire top surfaces of respective first protective layers 172. The first protective layers 172 may not extend onto the active regions 105, and may not overlap the active regions 105 and the channel structures 140 in the Z-direction, e.g., the first protective layers 172 may not overlap tops of the active regions 105 or upper surfaces of channel layers of the channel structures 140. The first protective layers 172 may be surrounded by the device isolation layer 110 and the gate structure 160, and may be in further contact with the second protective layers 174 and/or the active regions 105, depending on levels on which they are located. The first protective layers 172 may include an insulating material, e.g., at least one of SiO, SiN, SiCN, SiOC, SiC, SiON, or SiOCN.

The second protective layers 174 may be disposed on lower surfaces of the lowermost first channel layers 141 of the channel structures 140. The second protective layers 174 may be disposed on the active regions 105, and may be disposed to, e.g., completely, fill a space between the active regions 105 and the first channel layers 141. As illustrated in FIG. 2A, in a cross-section in the X-direction, side surfaces of the second protective layers 174 may be coplanar, e.g., aligned, with side surfaces of the channel structures 140. The second protective layers 174 may be disposed between the first source/drain region 150A and the second source/drain region 150B in the X-direction. The second protective layers 174 may be in, e.g., direct, contact with the interconnection spacer layers 182 and the buried interconnection line 185 in at least one region.

As illustrated in FIG. 2C, the side surfaces of the second protective layers 174 may be located on a straight line, e.g., aligned, with the side surfaces of the channel structures 140 and side surfaces of the active regions 105, in a cross-section in the Y-direction. For example, as illustrated in FIG. 2C, the straight line may have an inclination, e.g., at an oblique angle with reference to the lower surface of the active region 105, to decrease widths of the channel structures 140 or the like in an upward direction, e.g., relative to the lower surface of the active region 105. In another example, the straight line may be perpendicular to the upper and lower surface of the active regions 105. The second protective layers 174 may overlap the channel structures 140 and the active regions 105 in the Z-direction (e.g., in a top view). The second protective layers 174 may overlap the gate structures 160 in the Z-direction, and may entirely overlap the gate structures 160. The second protective layers 174 may not be in direct contact with the lower surfaces of the gate structures 160, but may be alternately arranged with the first protective layers 172 on the lower surfaces of the gate structures 160 in an extension direction of the gate structures 160.

The second protective layers 174 may include an insulating material, e.g., at least one of SiO, SiN, SiCN, SiOC, SiC, SiON, or SiOCN. The second protective layers 174 may include a same material or a different material relative to the first protective layers 172. For example, the first protective layers 172 may include silicon nitride, and the second protective layers 174 may include silicon oxide.

The first and second protective layers 172 and 174 may be layers for allowing the buried interconnection line 185 to self-align with the second source/drain region 150B, when the buried interconnection line 185 is formed. The first and second protective layers 172 and 174 may include a material different from that of the active region 105 and the second source/drain region 150B, thereby inducing an opening OP (See FIG. 19A) for forming the buried interconnection line 185 to be aligned with the second source/drain region 150B, in forming the opening OP. This will be described in more detail with reference to FIG. 19A below. In some embodiments, the first and second protective layers 172 and 174 may be partially recessed from lower surfaces of the first and second protective layers 172 and 174, respectively, in a region contacting the buried interconnection line 185, e.g., a portion of the buried interconnection line 185 may partially extend into the first and second protective layers 172 and 174 to extend above the lowermost surfaces of the first and second protective layers 172 and 174. According to embodiments, degrees to which the first and second protective layers 172 and 174 are recessed and shapes of regions of the first and second protective layers 172 and 174 adjacent to the buried interconnection line 185 may be variously changed.

The first protective layers 172 may have a first thickness T1 (e.g., along the Z direction), and the second protective layers 174 may have a second thickness T2 (e.g., along the Z direction), equal to or different from the first thickness T1. Each of the first thickness T1 and the second thickness T2 may be, e.g., in a range of about 5 nm to about 100 nm. For example, the second thickness T2 may be greater than the first thickness T1. In embodiments, the thicknesses of the first and second protective layers 172 and 174 and levels of upper and lower surfaces thereof may be variously changed.

The buried interconnection line 185 may be disposed between adjacent gate structures 160, and may be disposed, e.g., to extend in the Y-direction. The buried interconnection line 185 may be a power interconnection line for applying a power voltage or a ground voltage, and may also be referred to as a buried power rail. The buried interconnection line 185 may penetrate through the active region 105 and the device isolation layer 110, and may further penetrate through the second interlayer insulating layer 194. The buried interconnection line 185 may be directly connected to a lower surface of the second source/drain region 150B through an upper surface of the buried interconnection line 185, to apply an electrical signal to the second source/drain region 150B. The buried interconnection line 185 may be formed by partially recessing the second source/drain region 150B.

In some embodiments, depending on depths of the first and second source/drain regions 150A and 150B, the buried interconnection line 185 may be in, e.g., direct, contact with the lower surface of the second source/drain region 150B without recessing the second source/drain region 150B.

The buried interconnection line 185 may be aligned between the gate structures 160 and between the channel structures 140 in the X-direction by the first and second protective layers 172 and 174. The buried interconnection line 185 may extend between adjacent second protective layers 174 in the X-direction, to be connected to the second source/drain region 150B. Therefore, the buried interconnection line 185 may be stably electrically isolated from the channel structures 140. Also, the buried interconnection line 185 may have a shape that protrudes between first protective layers 172 adjacent in the X-direction. The buried interconnection line 185 may be stably electrically isolated from the gate electrodes 165 by the first protective layers 172.

The buried interconnection line 185 may be in, e.g., direct, contact with at least some of lower and side surfaces of the first and second protective layers 172 and 174, and may be curved along the lower and side surfaces. In a region of the buried interconnection line 185 connected to the second source/drain region 150B, an upper surface of the buried interconnection line 185 may be located on a first level L1 at edges or in end portions in the X-direction, and may be located on a second level L2, higher than the first level L1, at a center in the X-direction (FIG. 2A). In a region of the buried interconnection line 185 not connected to the second source/drain region 150B, the upper surface of the buried interconnection line 185 may be located on a third level L3, equal to or lower than the second level L2, in the center in the X-direction (FIG. 2B). The interconnection spacer layers 182 may be disposed on side surfaces of the buried interconnection line 185 in the X-direction.

The buried interconnection line 185 may include a metal material and/or a semiconductor material. In some embodiments, the buried interconnection line 185 may have a multilayer structure including a semiconductor layer and a metal layer. The buried interconnection line 185 may include, e.g., at least one of polycrystalline silicon (Si), tungsten (W), copper (Cu), aluminum (Al), cobalt (Co), ruthenium (Ru), titanium (T1), or molybdenum (Mo).

The interconnection spacer layers 182 may be disposed on the side surfaces of the buried interconnection line 185, and may extend along the buried interconnection line 185 in the Y-direction. The interconnection spacer layers 182 may be disposed between the buried interconnection line 185 and the active regions 105, to electrically isolate the buried interconnection line 185 from the active regions 105. For example, the interconnection spacer layers 182 may be disposed only between the active regions 105 and the buried interconnection line 185. Upper surfaces of the interconnection spacer layers 182 may be in, e.g., direct, contact with the first and second protective layers 172 and 174.

The interconnection spacer layers 182 may include an insulating material, e.g., at least one of silicon oxide, silicon nitride, or silicon oxynitride. In example embodiments, a thickness of the interconnection spacer layers 182 may be variously changed. In some embodiments, all of the active regions 105 may not remain below the second protective layers 174, and in this case, the interconnection spacer layers 182 may be omitted.

The lower interconnection layer 187 may be disposed in the second interlayer insulating layer 194, and may be disposed on the lower surface of the buried interconnection line 185. The lower interconnection layer 187 may form a power delivery network (PDN) together with the buried interconnection line 185. The lower interconnection layer 187 may include a conductive material, and may extend along the buried interconnection line 185. The lower interconnection layer 187 may have a width greater than a width of the buried interconnection line 185 in the X-direction. The lower interconnection layer 187 may include, e.g., at least one of tungsten (W), copper (Cu), aluminum (Al), cobalt (Co), ruthenium (Ru), titanium (T1), or molybdenum (Mo). In embodiments, a thickness, a shape, and the like of the lower interconnection layer 187 may be variously changed.

The inner spacer layers 130 may be disposed, together with the gate electrodes 165, between the first to fifth channel layers 141, 142, 143, 144, and 145 in the Z-direction. The gate electrodes 165 may be stably spaced apart from the first and second source/drain regions 150A and 150B by the inner spacer layers 130, to be electrically separated from each other. The inner spacer layers 130 may have a shape in which side surfaces facing the gate electrodes 165 are convexly rounded toward the gate electrodes 165. The inner spacer layers 130 may be formed of, e.g., at least one of an oxide, a nitride, or an oxynitride, and in particular, may be formed of a low-κ film.

In some embodiments, the inner spacer layers 130 may be further disposed on both side surfaces of the second protective layers 174 in the X-direction. In some embodiments, the inner spacer layers 130 may be omitted.

The first interlayer insulating layer 192 may be disposed to cover upper surfaces of the first and second source/drain regions 150A and 150B, upper surfaces of the gate structures 160, and an upper surface of the device isolation layer 110. The second interlayer insulating layer 194 may be disposed to cover lower surfaces of the active regions 105 and a lower surface of the device isolation layer 110. The first and second interlayer insulating layers 192 and 194 may include at least one of, e.g., an oxide, a nitride, an oxynitride, and/or a low-κ material. According to embodiments, each of the first and second interlayer insulating layers 192 and 194 may include a plurality of insulating layers.

The contact plugs 195 may be disposed on the buried interconnection line 185. The contact plugs 195 may penetrate through the first interlayer insulating layer 192 to be connected to the first source/drain regions 150A, and may apply an electrical signal to the first source/drain regions 150A. The contact plugs 195 may have side surfaces inclined to decrease a width thereof toward the first source/drain regions 150A according to an aspect ratio. The contact plugs 195 may extend from an upper portion, e.g., onto a level, lower than lower surfaces of uppermost fifth channel layers 145 of each of the channel structures 140. In example embodiments, the contact plugs 195 may be disposed to contact upper surfaces of the first source/drain regions 150A, without recessing the first source/drain regions 150A. The contact plugs 195 may be further disposed to be connected to the gate electrodes 165 (not illustrated). Also, an interconnection structure including an interconnection line may be further disposed on the contact plugs 195.

Each of the contact plugs 195 may include a metal silicide layer disposed on a lower end thereof, and may further include a barrier layer disposed on the metal silicide layer and sidewalls thereof. For example, the barrier layer may include a metal nitride, e.g., a titanium nitride film (TiN), a tantalum nitride film (TaN), or a tungsten nitride film (WN). In another example, the contact plugs 195 may include a metal material, e.g., aluminum (Al), tungsten (W), molybdenum (Mo), or the like. In example embodiments, the number and arrangement of conductive layers constituting each of the contact plugs 195 may be variously changed.

In the semiconductor device 100, the structure of FIGS. 2A to 2C may be inverted to locate, e.g., position, the buried interconnection line 185 in an upper portion thereof and may be packaged. Since the semiconductor device 100 may include the buried interconnection line 185 disposed below the first and second source/drain regions 150A and 150B, a degree of integration may be improved. Also, since the buried interconnection line 185 may be self-aligned by the first and second protective layers 172 and 174, and may be connected to the second source/drain region 150B, an electrical short circuit with other components may be prevented or substantially minimized.

In the description of embodiments below, descriptions overlapping those described above with reference to FIGS. 1 to 2C will be omitted.

Figure 3A:
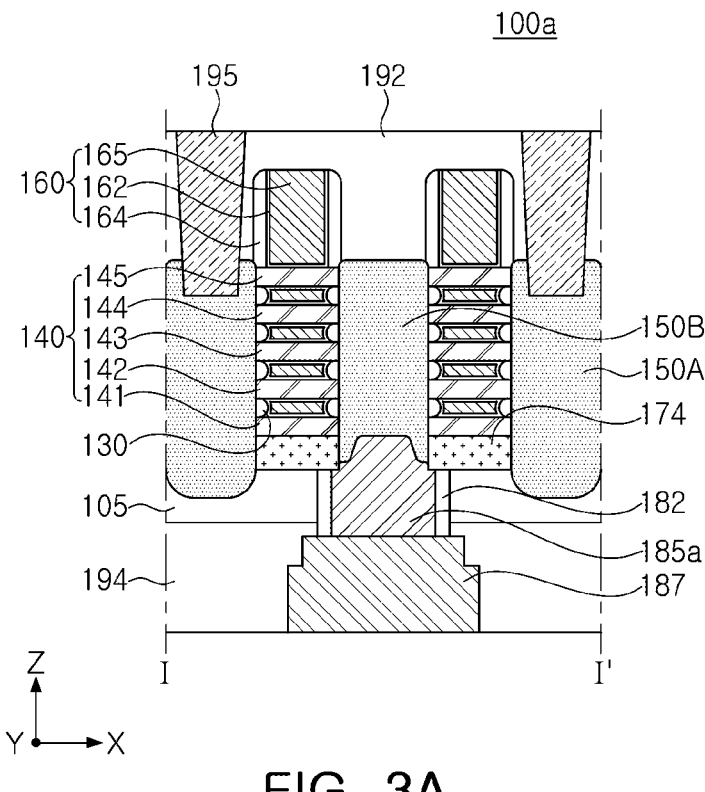
FIGS. 3A and 3B are schematic cross-sectional views illustrating a semiconductor device according to example embodiments.
Figure 3B:
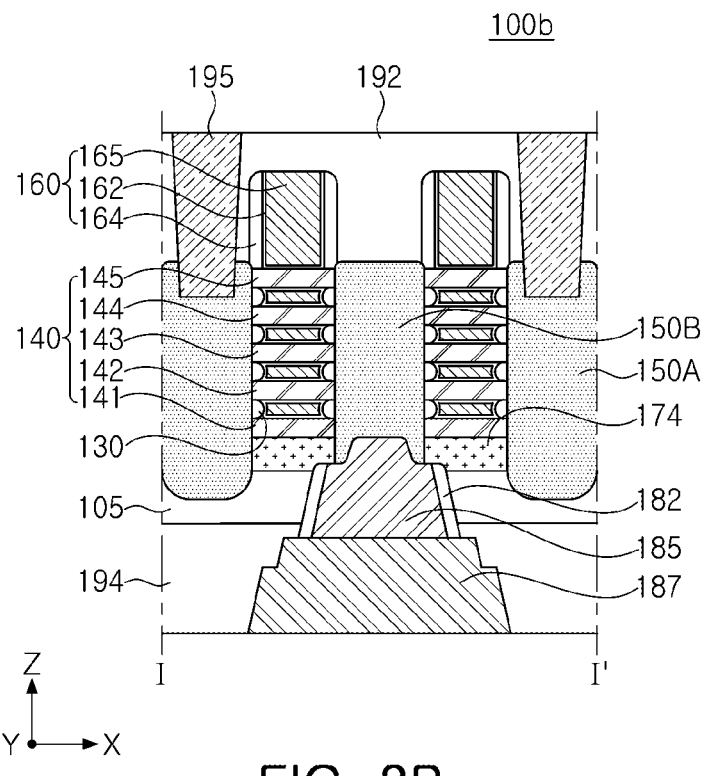

FIGS. 3A and 3B are schematic cross-sectional views illustrating a semiconductor device according to example embodiments. FIGS. 3A and 3B illustrate a region corresponding to FIG. 2A.

Referring to FIG. 3A, in a semiconductor device 100a, a buried interconnection line 185a may not recess the and second protective layers 172 and 174, and may extend along a portion of lower surfaces and a portion of side surfaces of the first and second protective layers 172 and 174. For example, as illustrated in FIG. 3A, the first and second protective layers 172 and 174 may have rectangular vertical cross-sections (i.e., without recesses therein), and the buried interconnection line 185a may extend around the rectangular vertical cross-sections of the first and second protective layers 172 and 174. The buried interconnection line 185a may extend upwardly toward the second source/drain region 150B between opposing side surfaces of the first and second protective layers 172 and 174. This structure may be formed in cases in which selectivity of the first and second protective layers 172 and 174 and the second source/drain region 150B is relatively high in a process of forming an opening OP to be described below with reference to FIG. 19A.

Referring to FIG. 3B, in a semiconductor device 100b, the buried interconnection line 185 and the lower interconnection layer 187 may have inclined side surfaces. In the buried interconnection line 185 and the lower interconnection layer 187, both side surfaces in the X-direction may have an inclination angle to increase widths thereof in a downward direction. Therefore, a width of the buried interconnection line 185 and a width of the lower interconnection layer 187 may increase in a downward direction.

Figure 4A:
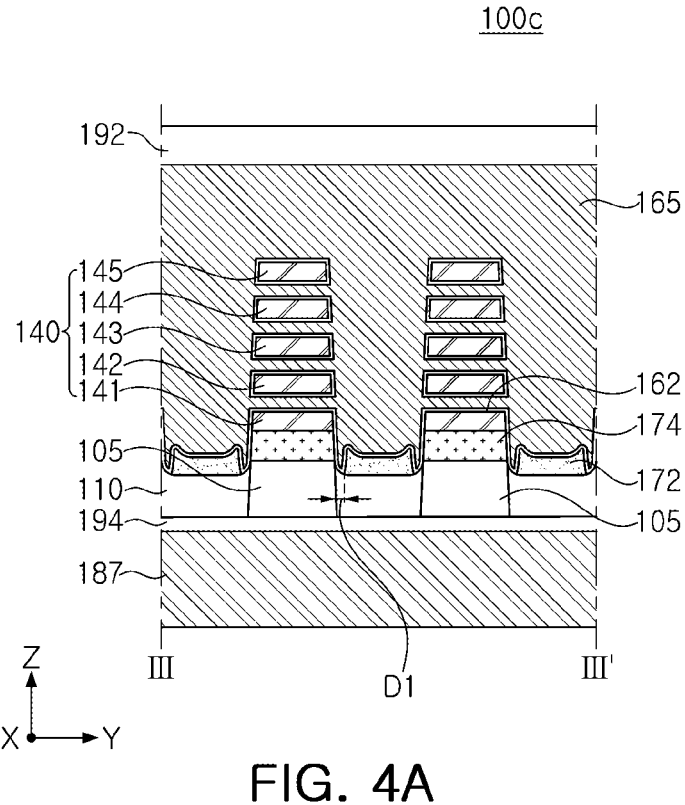
FIGS. 4A and 4B are schematic cross-sectional views illustrating a semiconductor device according to example embodiments.
Figure 4B:
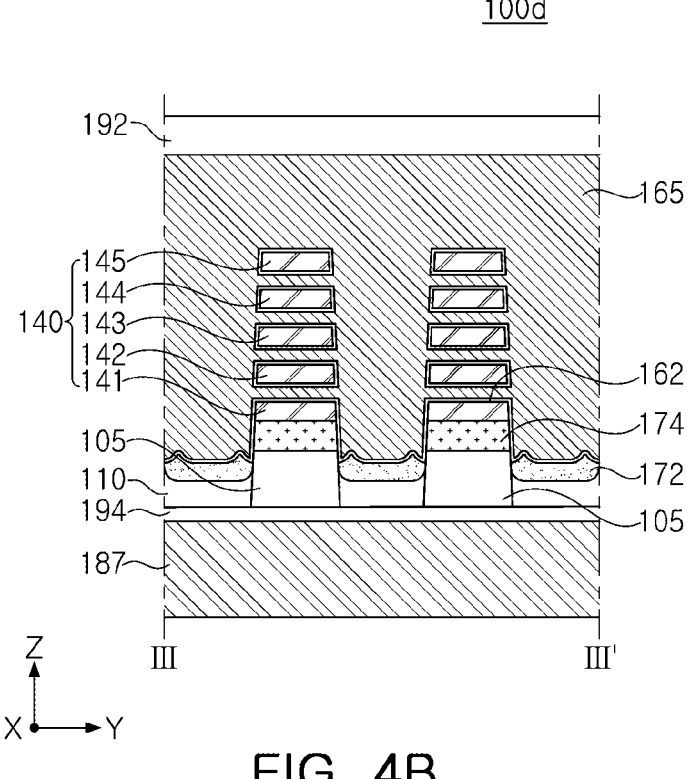

FIGS. 4A and 4B are schematic cross-sectional views illustrating a semiconductor device according to example embodiments. FIGS. 4A and 4B illustrate a region corresponding to FIG. 2C.

Referring to FIG. 4A, in a semiconductor device 100c, an arrangement of the first protective layers 172 may be different from that in the embodiment of FIG. 2C. The first protective layers 172 may be spaced apart from side surfaces of active regions 105 by a predetermined distance D1, and may be located on a device isolation layer 110. The distance D1 may be variously changed in embodiments. The first protective layers 172 may also be spaced apart from the second protective layers 174.

Such a structure may be formed, as a depth of a preliminary first protective layer 172P to be removed is changed during the manufacturing process described with reference to FIG. 12B. As such, in embodiments, positions of end portions of the first protective layers 172 may be changed, and accordingly, curved shapes of upper surfaces of the first protective layers 172 may also be changed.

Referring to FIG. 4B, in a semiconductor device 100*d*, arrangement of the first protective layers 172 may be different from that in the embodiment of FIG. 2C. The first protective layers 172 may be located on a lower level than the second protective layers 174, and thus may not be in contact with the second protective layers 174.

Such a structure may be formed, as a level of an upper surface of the device isolation layer 110 to be formed is changed during the manufacturing process described with reference to FIG. 9B. As such, in embodiments, relative levels of the first protective layers 172 may be variously changed. For example, in some embodiments, uppermost ends of the first protective layers 172 may be located on a level lower than lower surfaces of the second protective layers 174.

Figure 5:
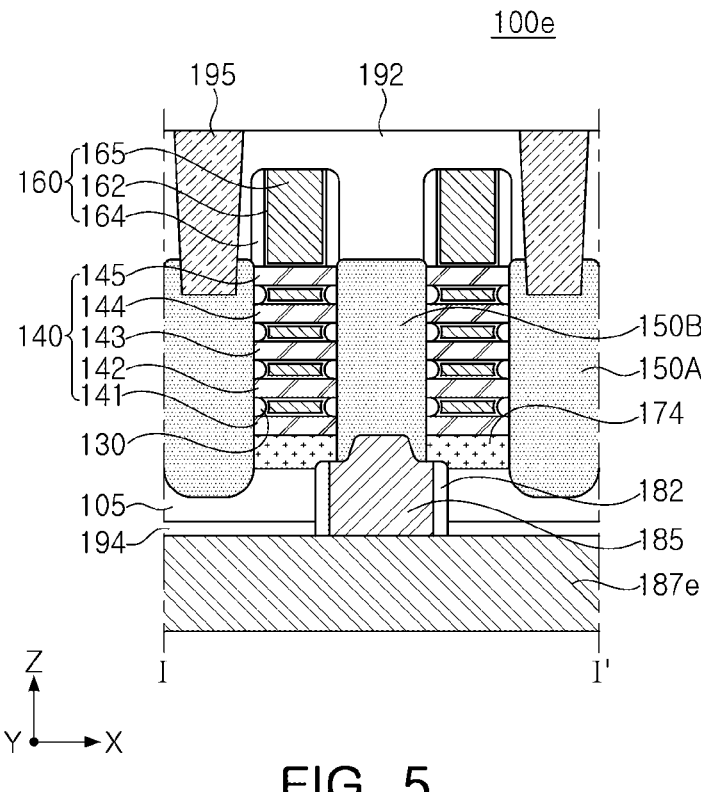
FIG. 5 is a schematic cross-sectional view illustrating a semiconductor device according to example embodiments.

FIG. 5 is a schematic cross-sectional view illustrating a semiconductor device according to example embodiments. FIG. 5 illustrates a region corresponding to FIG. 2A.

Referring to FIG. 5, in a semiconductor device 100*e*, a lower interconnection layer 187*e* may extend in the X-direction, unlike the embodiment of FIG. 2A. For example, the lower interconnection layer 187*e* may extend below active regions 105 along the active regions 105. In this case, the buried interconnection line 185 may have a limited length in the X-direction and the Y-direction, instead of having a linear shape, and may function as a contact structure.

In some embodiments, a conductive layer extending in the X-direction may be further disposed between the buried interconnection line 185 and the lower interconnection layer 187*e*. As such, in embodiments, an extension direction of the lower interconnection layer 187*e* may be variously changed, and accordingly, a shape of the buried interconnection line 185 may also be changed.

Figure 6A:
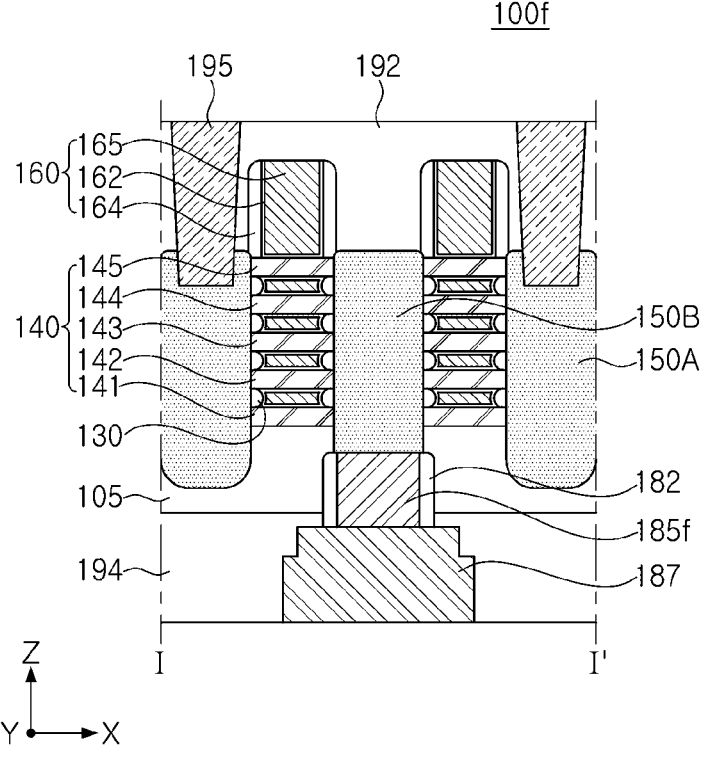
FIGS. 6A, 6B and 6C are cross-sectional views illustrating a semiconductor device according to example embodiments.
Figure 6B:
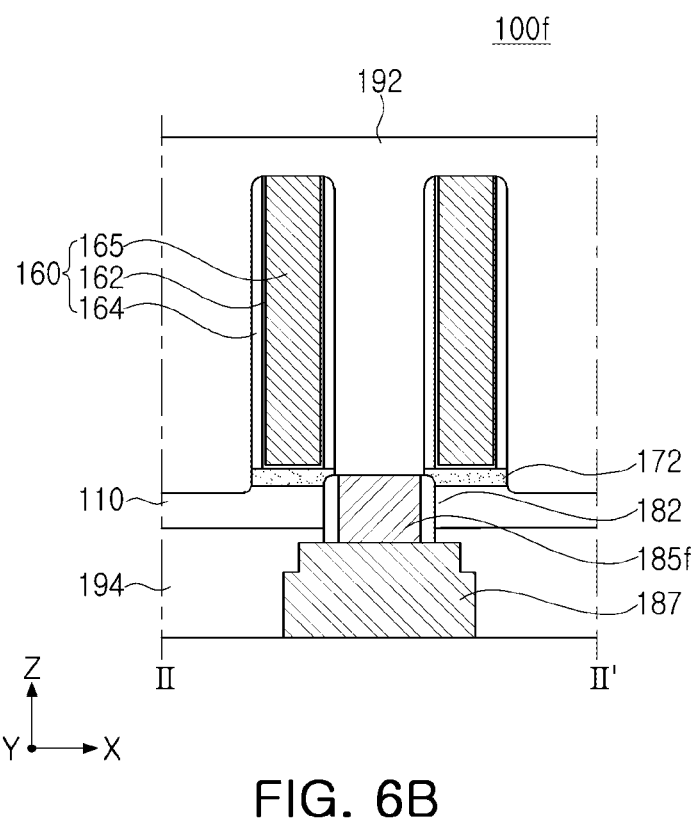
Figure 6C:
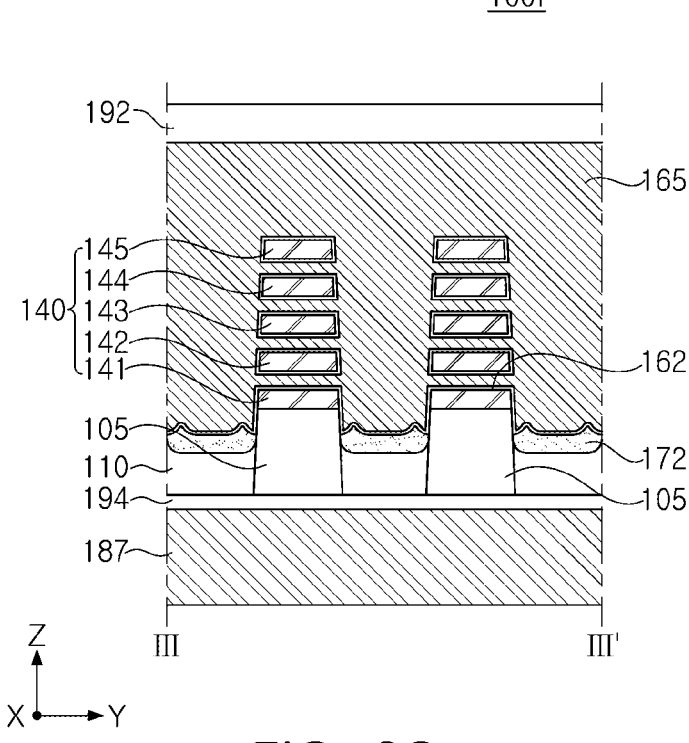

FIGS. 6A to 6C are cross-sectional views illustrating a semiconductor device according to example embodiments. FIGS. 6A to 6C illustrate cross-sections corresponding to FIGS. 2A to 2C, respectively.

Referring to FIGS. 6A to 6C, a semiconductor device 100*f* may not include second protective layers 174, unlike the embodiment of FIGS. 2A to 2C. An upper surface of a buried interconnection line 185*f* may have no curve or may have only a curve along first protective layers 172. That is, the semiconductor device 100*f* may include only the first protective layers 172. When an electrical short between the buried interconnection line 185*f* and gate electrodes 165 is relatively and mainly problematic in the semiconductor device 100*f*, compared to electrical short between the buried interconnection line 185*f* and channel structures 140, the semiconductor device 100*f* may include only the first protective layers 172.

Figure 7:
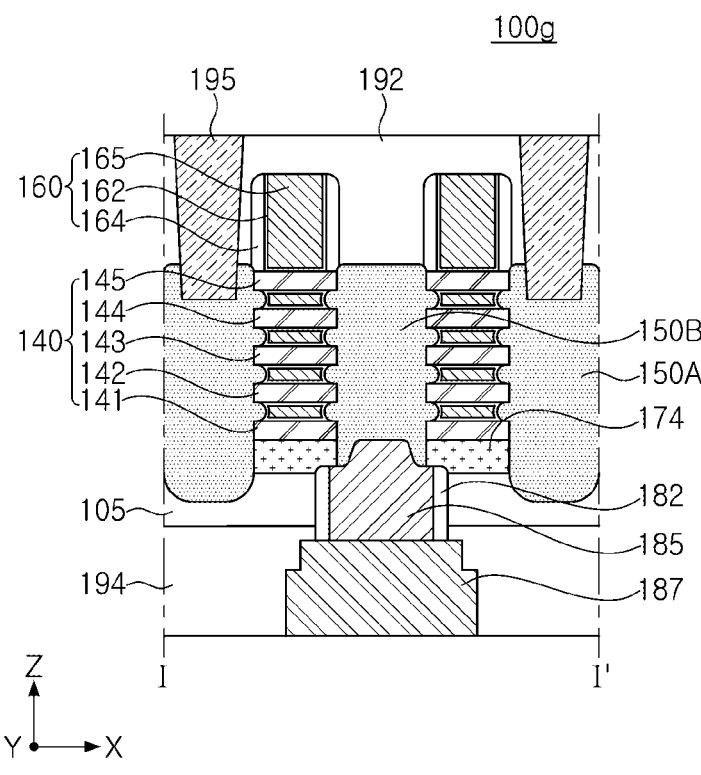
FIG. 7 is a view illustrating a semiconductor device according to example embodiments.

FIG. 7 is a view illustrating a semiconductor device according to example embodiments. FIG. 7 illustrates a region corresponding to FIG. 2A.

Referring to FIG. 7, a semiconductor device 100*g* may not include an inner spacer layer 130, unlike the embodiment of FIG. 2A. In this case, the first and second source/drain regions 150A and 150B may have a shape expanding into a region in which the inner spacer layers 130 are omitted. Also, the gate electrodes 165 may be spaced apart from the first and second source/drain regions 150A and 150B by the gate dielectric layers 162. In another embodiment, first and second source/drain regions 150A and 150B may not expand into a region in which the inner spacer layers 130 are omitted, and the gate electrodes 165 may be disposed to expand in the X-direction.

According to this structure, the inner spacer layer 130 may be omitted to have more improved crystallinity of the first and second source/drain regions 150A and 150B, when the first and second source/drain regions 150A and 150B are grown. In some embodiments, the inner spacer layer 130 may be omitted only in some devices of the semiconductor device 100*g*. For example, when SiGe is used for the first and second source/drain regions 150A and 150B in a pFET, the inner spacer layer 130 may be selectively omitted only in the pFET to improve crystallinity of the SiGe.

Figure 8A:
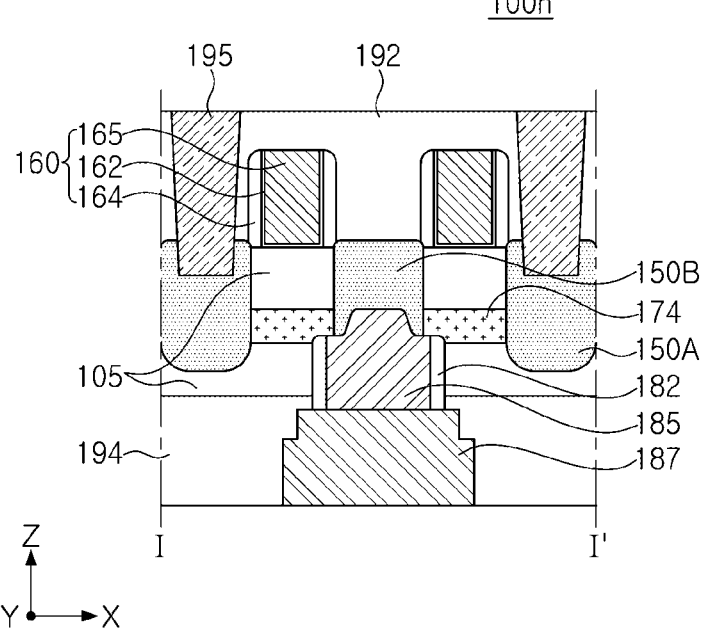
FIGS. 8A, 8B, and 8C are cross-sectional views illustrating a semiconductor device according to example embodiments.
Figure 8B:
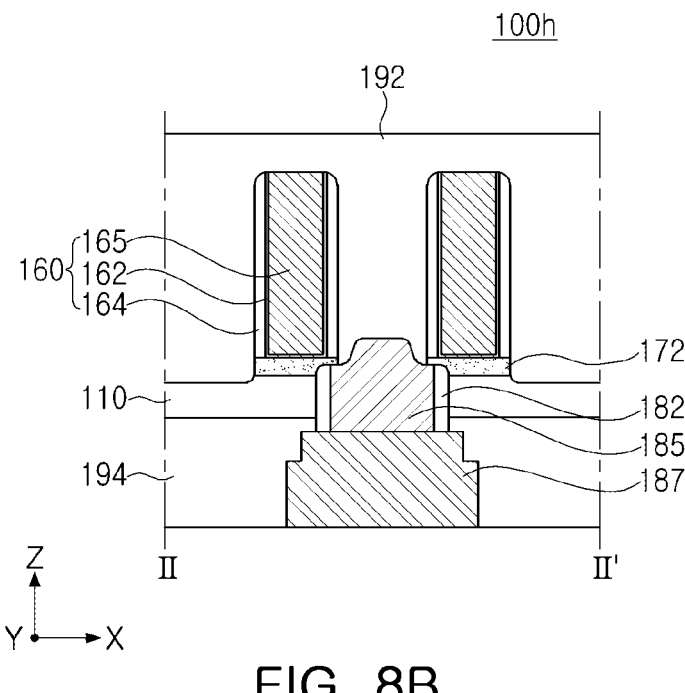
Figure 8C:
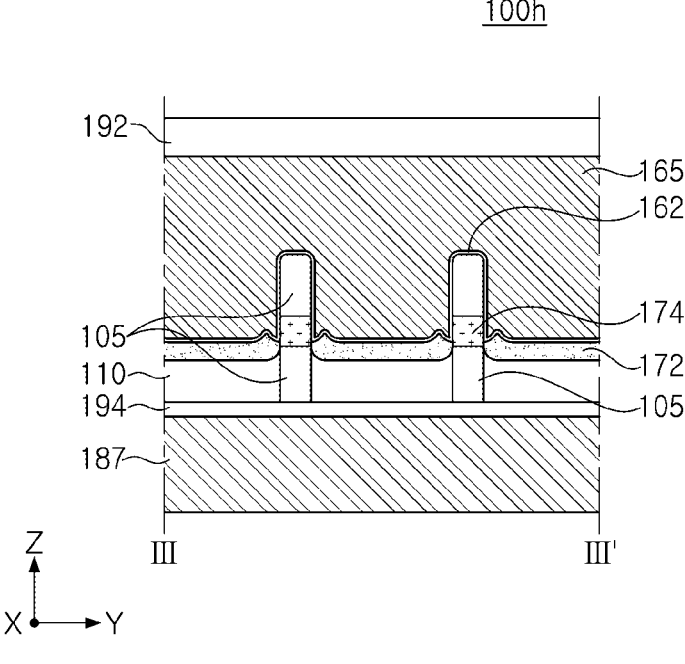

FIGS. 8A to 8C are cross-sectional views illustrating a semiconductor device according to example embodiments. FIGS. 8A to 8C illustrate cross-sections corresponding to FIGS. 2A to 2C, respectively.

Referring to FIGS. 8A to 8C, a semiconductor device 100*h* may not include channel structures 140, unlike in the embodiment of FIGS. 2A to 2C, and accordingly, arrangement of the gate structures 160 may be different from that in the above embodiment. The semiconductor device 100*h* may include FinFETs not including a separate channel layer.

In the semiconductor device 100*h*, a channel region of transistors may be limited to the active regions 105 of a fin structure, which may be an active structure. Also, separate channel layers may not be interposed in the gate electrodes 165. Other descriptions of gate electrodes 165, descriptions of the first and second protective layers 172 and 174, and descriptions of the buried interconnection line 185 may be applied in a similar manner to the embodiment of FIGS. 2A to 2C. Such a semiconductor device 100*h* may be additionally disposed in one region of a semiconductor device according to other embodiments.

FIGS. 9A to 20B are views illustrating stages in a method of manufacturing a semiconductor device according to example embodiments. FIGS. 9A to 20B illustrate an embodiment of a method of manufacturing the semiconductor device of FIGS. 1 to 2C, and illustrate cross-sectional views of FIG. 1, taken along lines I-I' and together.

Figure 9A:
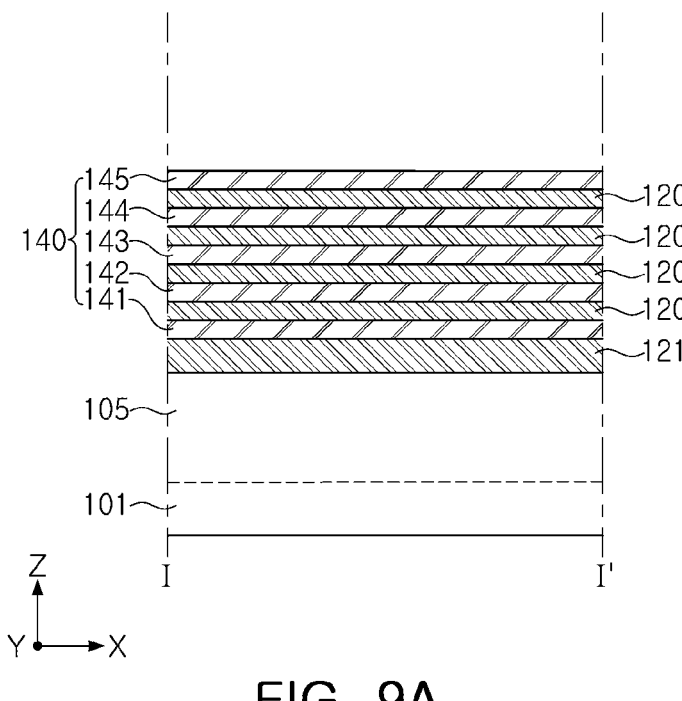
FIGS. 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A and 20B are views illustrating stages in a method of manufacturing a semiconductor device according to example embodiments.
Figure 9B:
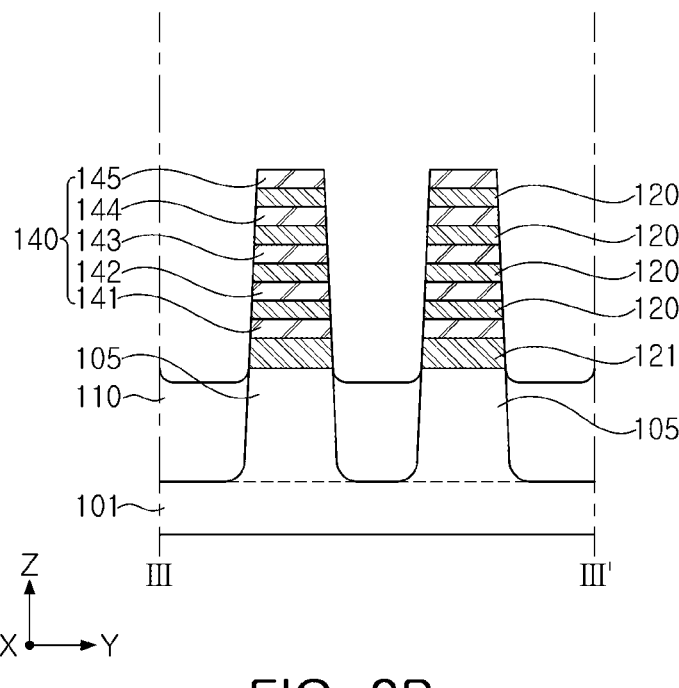

Referring to FIGS. 9A and 9B, first and second sacrificial layers 121 and 120 and first to fifth channel layers 141, 142, 143, 144, and 145 may be alternately stacked on a substrate 101 to form active structures including the active regions 105.

The first sacrificial layers 121 may be layers to be replaced with the second protective layers 174 by a subsequent process, as illustrated in FIGS. 2A and 2C. The second sacrificial layers 120 may be layers to be replaced with the gate dielectric layers 162 and the gate electrodes 165 below the fifth channel layer 145 by a subsequent process, as illustrated in FIGS. 2A and 2C. The first and second sacrificial layers 121 and 120 may be formed of a material having etch selectivity with respect to the first to fifth channel layers 141, 142, 143, 144, and 145, respectively. The first to fifth channel layers 141, 142, 143, 144, and 145 may include a material different from that of the first and second sacrificial layers 121 and 120. The first and second sacrificial layers 121 and 120 and the first to fifth channel layers 141, 142, 143, 144, and 145 may include, e.g., a semiconductor material including at least one of silicon (Si), silicon germanium (SiGe), or germanium (Ge) and may or may not include impurities. For example, the first and second sacrificial layers 121 and 120 may include silicon germanium (SiGe), and the first to fifth channel layers 141, 142, 143, 144, and 145 may include silicon (Si). For example, the first and second sacrificial layers 121 and 120 may include silicon germanium (SiGe) having different compositions.

For example, the first sacrificial layers 121 may include germanium (Ge) at a higher concentration than the second sacrificial layers 120.

The first and second sacrificial layers 121 and 120 and the first to fifth channel layers 141, 142, 143, 144, and 145 may be formed by performing an epitaxial growth process from the substrate 101. The number of layers in channel layers (e.g., 141, 142, 143, 144, and 145) with which the first and second sacrificial layers 121 and 120 are alternately stacked may be variously changed in some embodiments.

Next, the active structures may be formed by patterning the first and second sacrificial layers 121 and 120, the first to fifth channel layers 141, 142, 143, 144, and 145, and an upper region of the substrate 101. The active structures may include the first and second sacrificial layers 121 and 120, and the first to fifth channel layers 141, 142, 143, 144, and 145, alternately stacked with each other, and may further include the active regions 105 formed to protrude upward by removing a portion of the substrate 101. The active structures may be formed to have a linear form extending in one direction, e.g., the X-direction, and may be formed to be spaced apart from each other in the Y-direction. Depending on an aspect ratio, side surfaces of the active structures may have an inclined shape to increase a width in a downward direction.

In a region from which a portion of the substrate 101 is removed, an insulating material may be filled, and a portion of the insulating material may be removed to protrude the active regions 105, to form the device isolation layer 110. An upper surface of the device isolation layer 110 may be formed to be lower than an upper surface of the active regions 105.

Figure 10A:
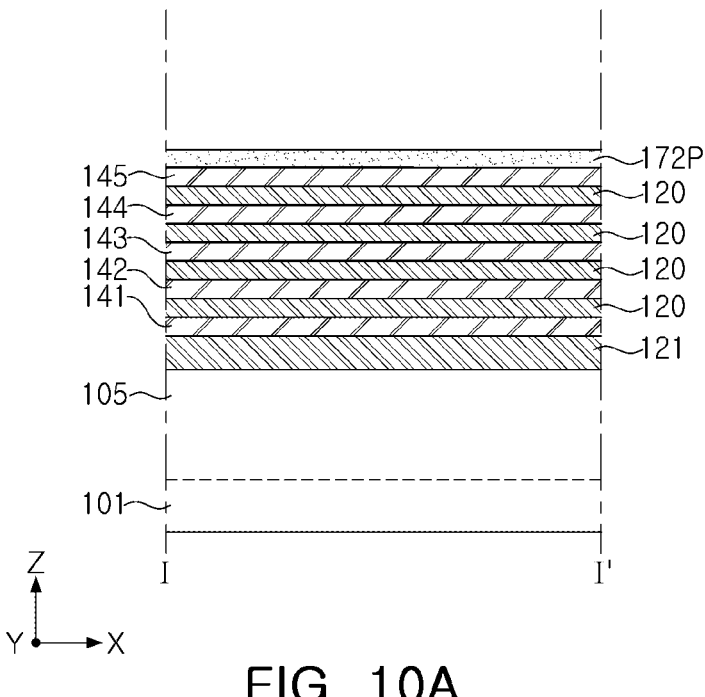
Figure 10B:
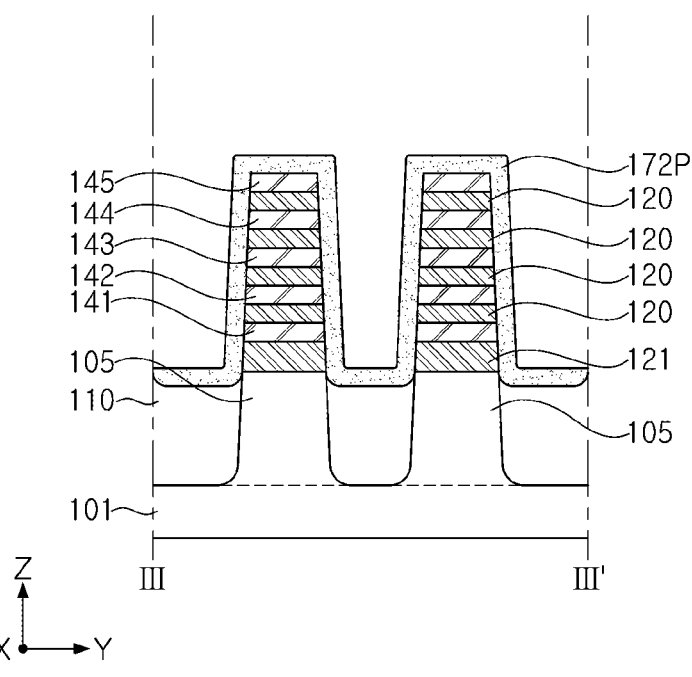

Referring to FIGS. 10A and 10B, a preliminary first protective layer 172P may be formed on the active structures. The preliminary first protective layer 172P may be formed to conformally extend along the active structures by a deposition process. For example, the preliminary first protective layer 172P may include a material different from that of the device isolation layer 110, e.g., may include silicon nitride.

Figure 11A:
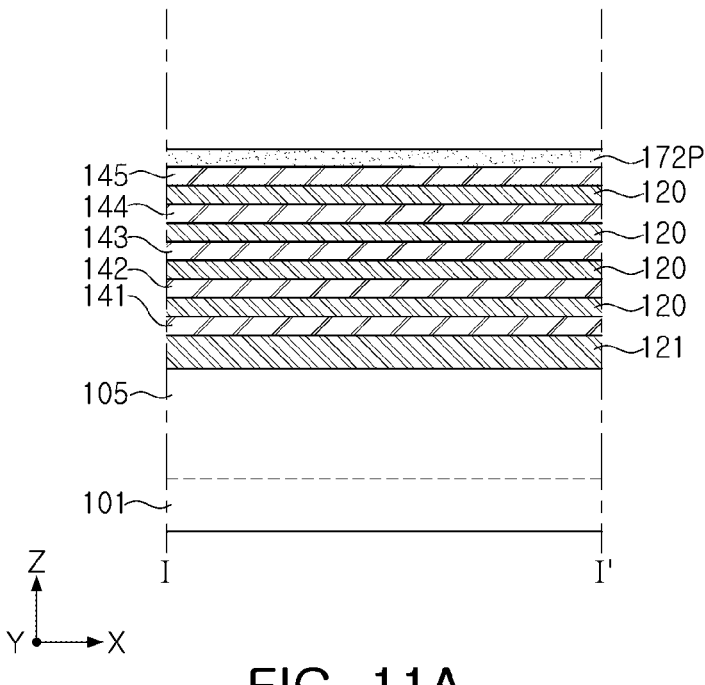
Figure 11B:
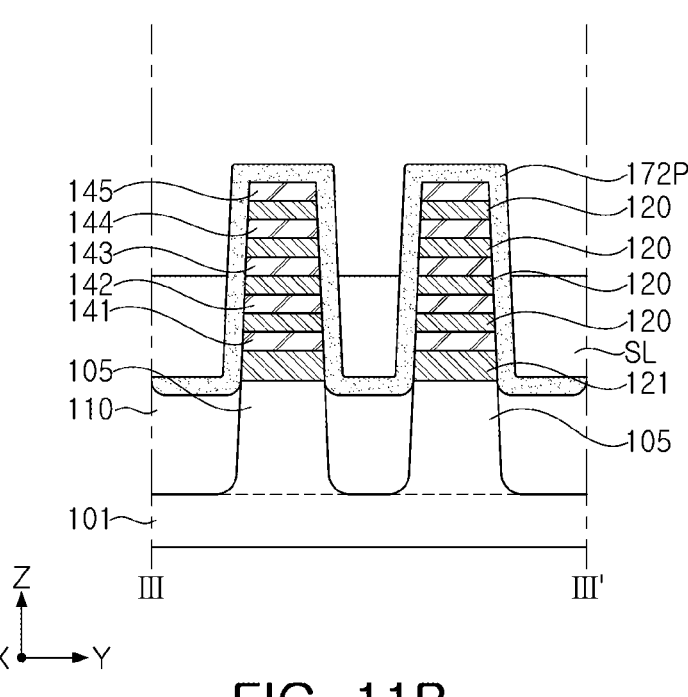

Referring to FIGS. 11A and 11B, a mask layer SL may be formed on the preliminary first protective layer 172P. The mask layer SL may be formed to partially fill a space between the active structures.

For example, the mask layer SL may be formed such that the active structures and the preliminary first protective layer 172P protrude onto the mask layer SL by performing a planarization process or an etching process, after spin-coating a carbon-containing material. In some embodiments, the coating process and the planarization process may be repeatedly performed twice each. The mask layer SL may be, e.g., a spin-on hardmask (SOH) layer.

Figure 12A:
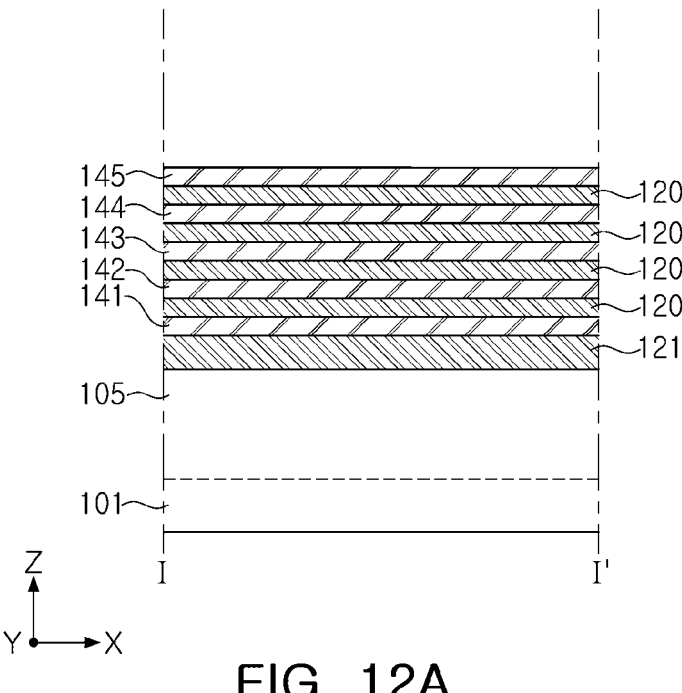
Figure 12B:
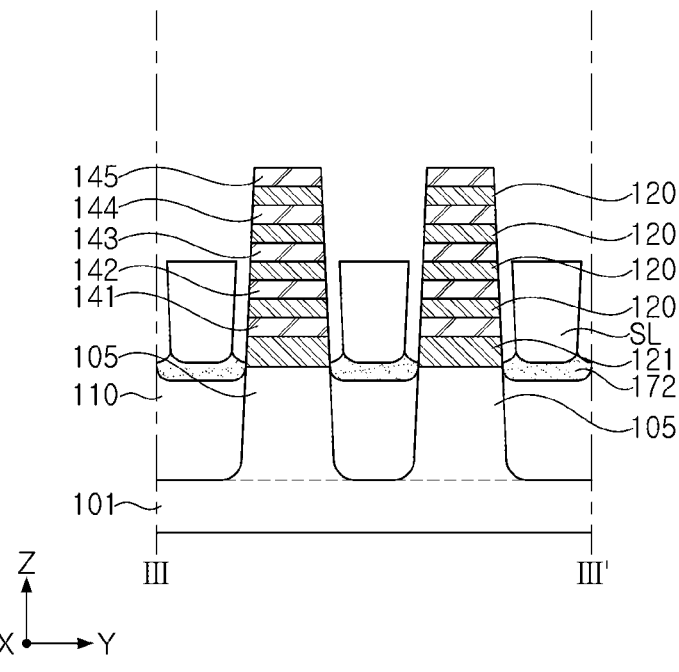

Referring to FIGS. 12A and 12B, the first protective layers 172 may be formed by partially removing the preliminary first protective layer 172P. The preliminary first protective layer 172P may be selectively removed from an exposed upper surface, with respect to the mask layer SL and the active structure.

The preliminary first protective layer 172P may be removed from an upper portion thereof to a predetermined depth by, e.g., a wet etching process. The preliminary first protective layer 172P may be removed to a level lower than that of a lowermost second sacrificial layer 120 among second sacrificial layers 120. A depth at which the preliminary first protective layer 172P is removed may be variously changed in embodiments. The first protective layers 172 may be formed on the device isolation layer 110 to be spaced apart from each other by the active structures in the Y-direction.

Next, the mask layer SL may be removed. The mask layer SL may be removed by performing an ashing process and a strip process.

Figure 13A:
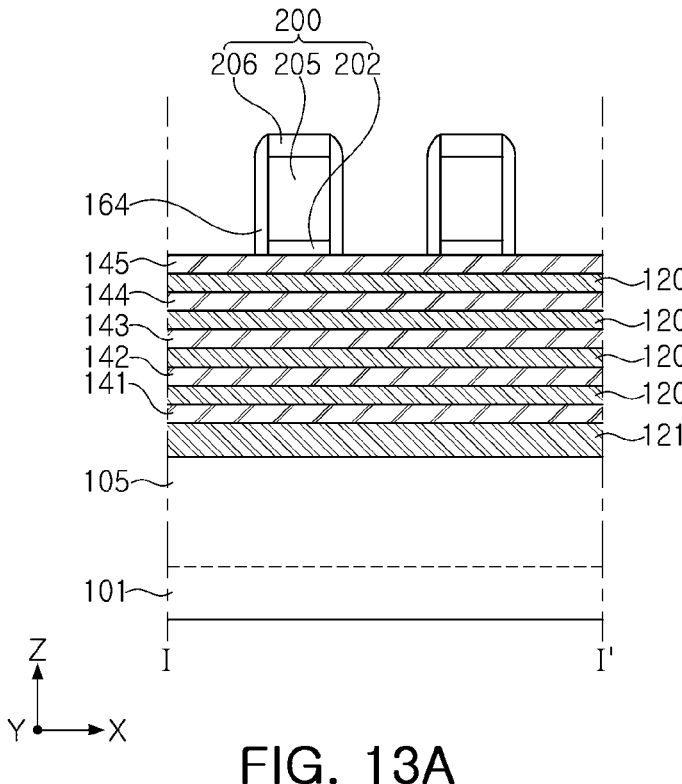
Figure 13B:
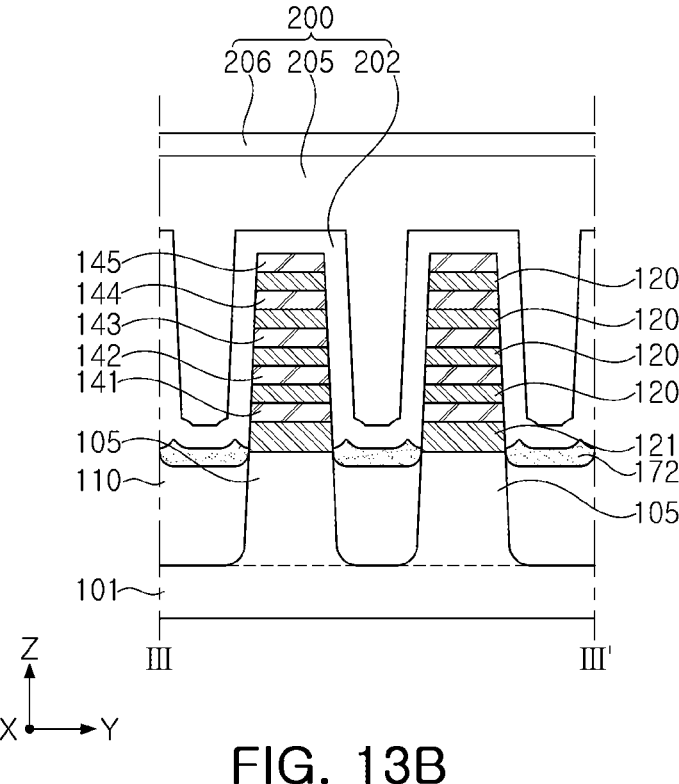

Referring to FIGS. 13A and 13B, a sacrificial gate structure 200 and gate spacer layers 164 may be formed on the active structures and the first protective layers 172.

Sacrificial gate structures 200 may be sacrificial structures formed in a region in which a gate dielectric layer 162 and a gate electrode 165 are disposed on the channel structures 140, as illustrated in FIGS. 2A and 2C, by a subsequent process. The sacrificial gate structures 200 may have a linear shape intersecting the active structures and extending in one direction. The sacrificial gate structures 200 may extend, e.g., in the Y-direction, and may be disposed to be spaced apart from each other in the X-direction.

The sacrificial gate structure 200 may include first and second sacrificial gate layers 202 and 205 and a mask pattern layer 206, sequentially stacked. The first and second sacrificial gate layers 202 and 205 may be patterned using the mask pattern layer 206. For example, the first and second sacrificial gate layers 202 and 205 may be an insulating layer and a conductive layer, respectively. In another example, the first and second sacrificial gate layers 202 and 205 may be formed as a single layer. For example, the first sacrificial gate layer 202 may include silicon oxide, and the second sacrificial gate layer 205 may include polysilicon. The mask pattern layer 206 may include silicon oxide and/or silicon nitride.

The gate spacer layers 164 may be formed on both sidewalls of the sacrificial gate structures 200. The gate spacer layers 164 may be formed of a low-κ material, and may include, e.g., at least one of SiO, SiN, SiCN, SiOC, SiON, or SiOCN.

Figure 14A:
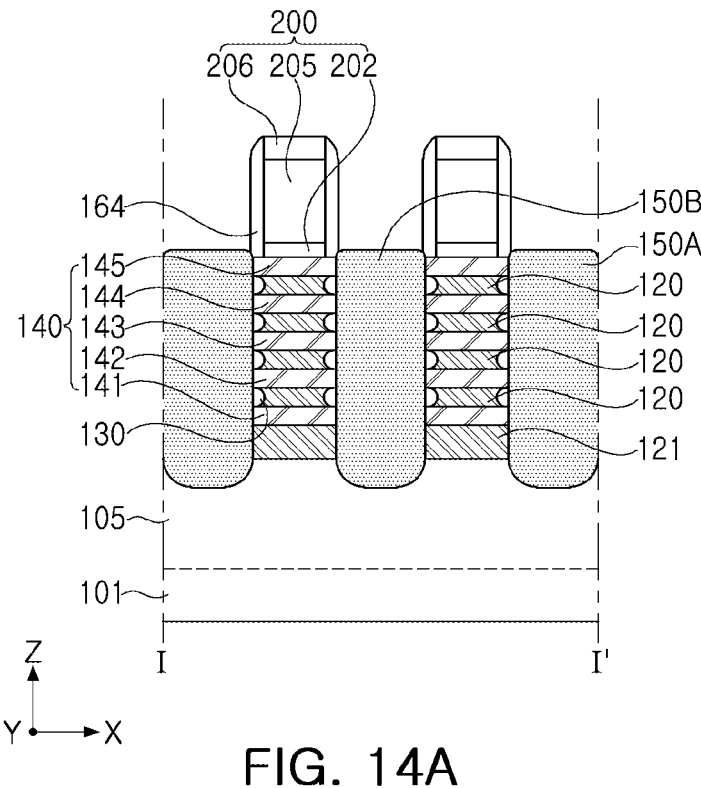
Figure 14B:
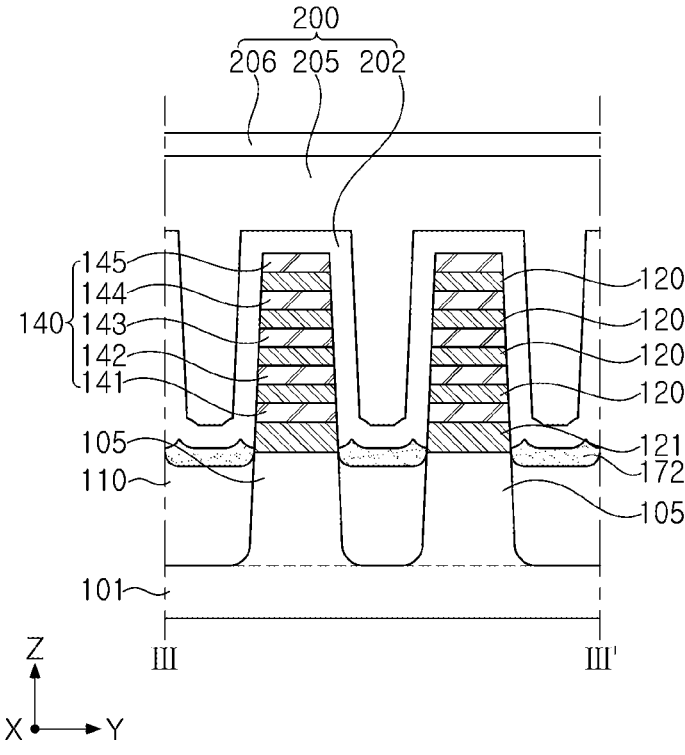

Referring to FIGS. 14A and 14B, the first and second sacrificial layers 121 and 120 and the first to fifth channel layers 141, 142, 143, 144, and 145, exposed by the sacrificial gate structure 200, may be partially removed to form recessed regions. For example, referring to FIGS. 13A and 14A, portions of the first and second sacrificial layers 121 and 120 and the first to fifth channel layers 141, 142, 143, 144, and 145, between adjacent ones of the sacrificial gate structures 200 may be removed to form recessed regions exposing the active regions 105. The first and second source/drain regions 150A and 150B may be formed in the recessed regions.

First, a portion of the exposed first and second sacrificial layers 121 and 120 and a portion of the exposed first to fifth channel layers 141, 142, 143, 144, and 145 may be removed using the sacrificial gate structures 200 and the gate spacer layers 164 as masks, to form the recess regions. Therefore, the first to fifth channel layers 141, 142, 143, 144, and 145 may form the channel structures 140 having a limited length in the X-direction. As such, the recessed regions may be formed between adjacent ones of the resultant channel structures 140.

Next, the second sacrificial layers 120 may be partially removed, and the inner spacer layers 130 may be formed. The second sacrificial layers 120 may be selectively etched with respect to the channel structures 140 and the first sacrificial layers 121 by, e.g., a wet etching process, and may be laterally removed from side surfaces of the second sacrificial layers 120 by a predetermined depth in the X-direction. The second sacrificial layers 120 may have concave side surfaces by lateral etching as described above.

The inner spacer layers 130 may be formed by filling a region from which the second sacrificial layers 120 are removed with an insulating material, and then removing the insulating material deposited on outer sides of the channel structures 140. The inner spacer layers 130 may be formed of the same material as the gate spacer layers 164. For example, the inner spacer layers 130 may include at least one of SiN, SiCN, SiOCN, SiBCN, or SiBN.

Next, the first and second source/drain regions 150A and 150B may be grown and formed from the active regions 105 and side surfaces of the channel structures 140 by, e.g., a selective epitaxial process. The first and second source/drain regions 150A and 150B may include impurities by in-situ doping, and may include a plurality of layers having different doping elements and/or doping concentrations.

Figures 15A, 15B:
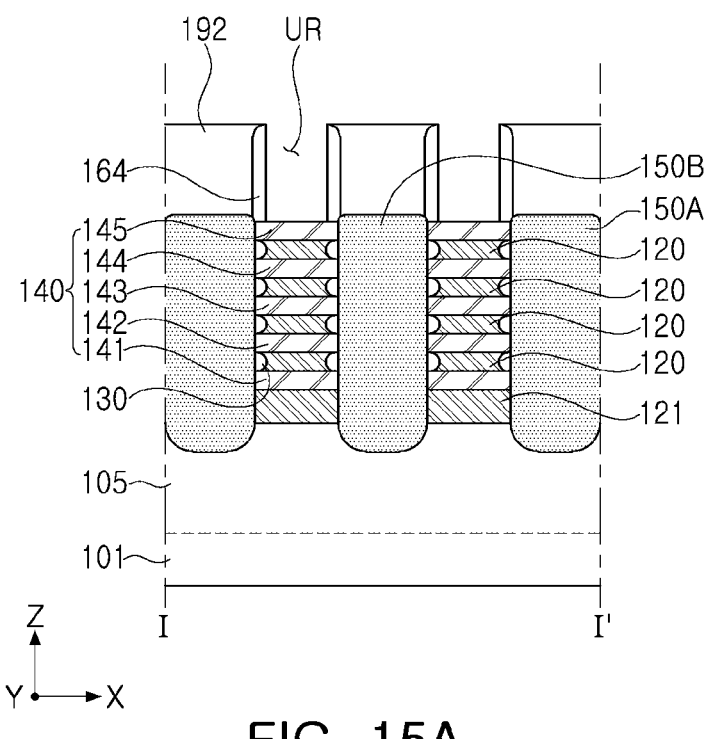

Referring to FIGS. 15A and 15B, the first interlayer insulating layer 192 may be formed, and upper gap regions UR may be formed by removing the sacrificial gate structures 200. The first interlayer insulating layer 192 may be formed by forming an insulating layer covering the sacrificial gate structures 200 and the first and second source/drain regions 150A and 150B, performing a planarization process, and exposing the mask pattern layer 206.

The sacrificial gate structures 200 may be selectively removed with respect to the gate spacer layers 164, the first interlayer insulating layer 192, the channel structures 140, and the inner spacer layers 130. The sacrificial gate structures 200 may be removed to form the upper gap regions UR in which the channel structures 140 and the first protective layers 172 are exposed.

Figures 16A, 16B:
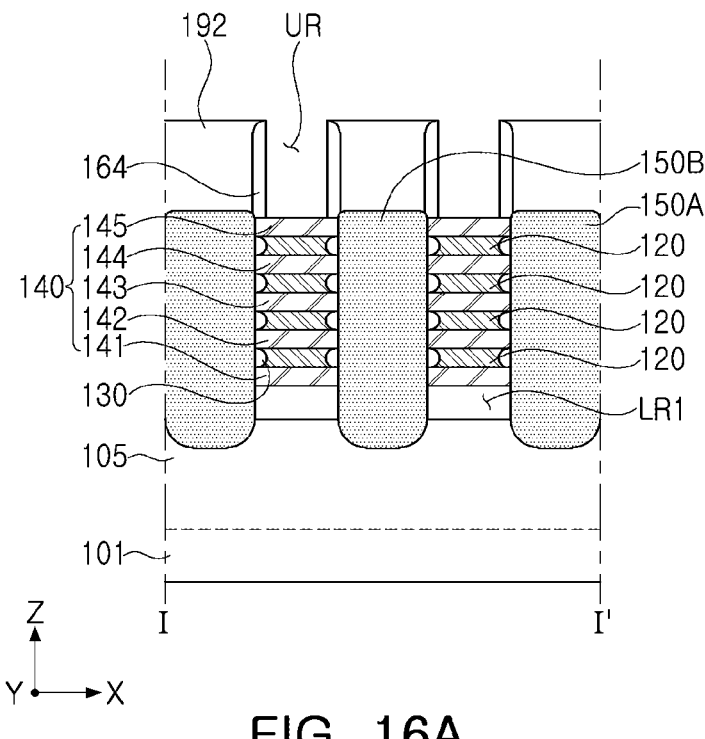

Referring to FIGS. 16A and 16B, first lower gap regions LR1 may be formed by removing the first sacrificial layers 121. The first sacrificial layers 121 may be selectively removed from side surfaces, in the Y-direction, of the first sacrificial layers 121 exposed through the upper gap regions UR.

In detail, since the first sacrificial layers 121 include a material different from that of the channel structures 140, the first sacrificial layers 121 may be selectively removed with respect to the channel structures 140 by a wet etching process. Also, since the first sacrificial layers 121 have a different composition, e.g., a different germanium (Ge) concentration from that of the second sacrificial layers 120, the first sacrificial layers 121 may be selectively removed with respect to the second sacrificial layers 120.

Figure 17A:
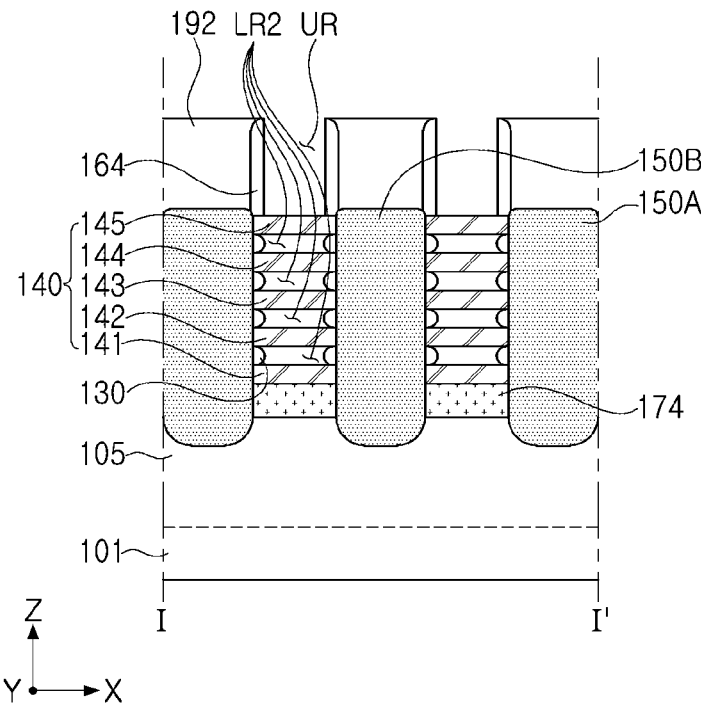
Figure 17B:
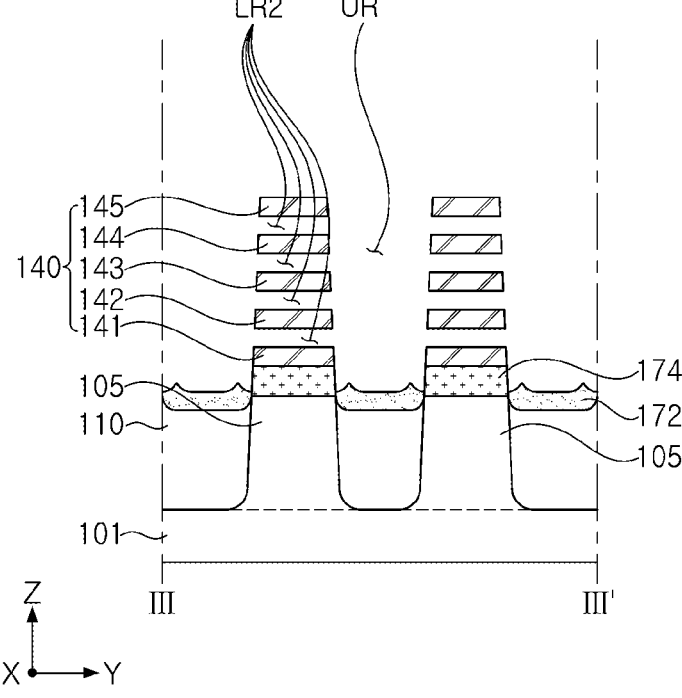

Referring to FIGS. 17A and 17B, the second protective layers 174 may be formed in the first lower gap regions LR1, and the second sacrificial layers 120 may be removed to form second lower gap regions LR2.

First, the second protective layers 174 may be formed by filling the first lower gap regions LR1 with an insulating material and then performing an etch-back process. The second protective layers 174 may be formed to only remain between the channel structures 140 and the active regions 105. The second protective layers 174 may include a material different from that of the first protective layers 172 and the device isolation layer 110.

Next, the second sacrificial layers 120 exposed through the upper gap regions UR may be removed to form the second lower gap regions LR2. The second sacrificial layers 120 may be selectively removed with respect to the channel structures 140.

Figure 18A:
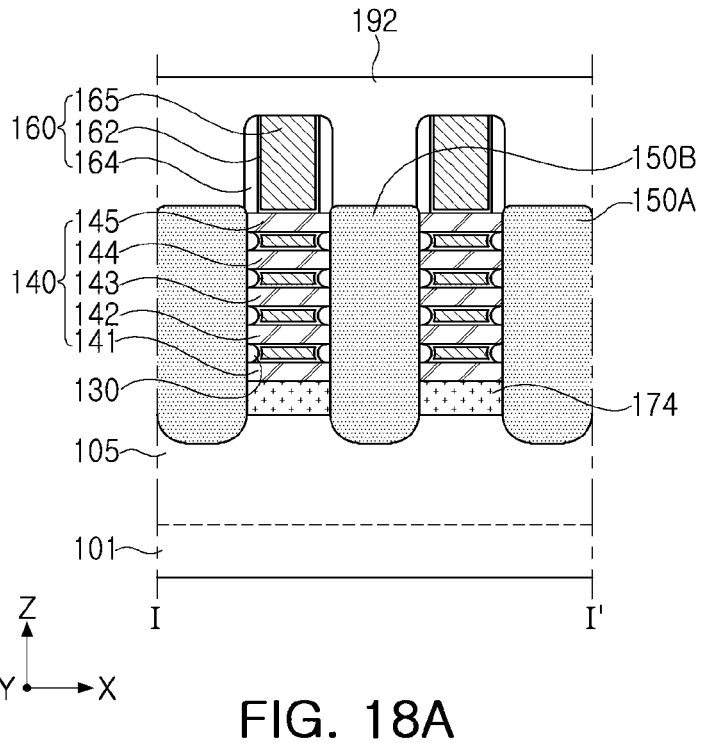
Figure 18B:
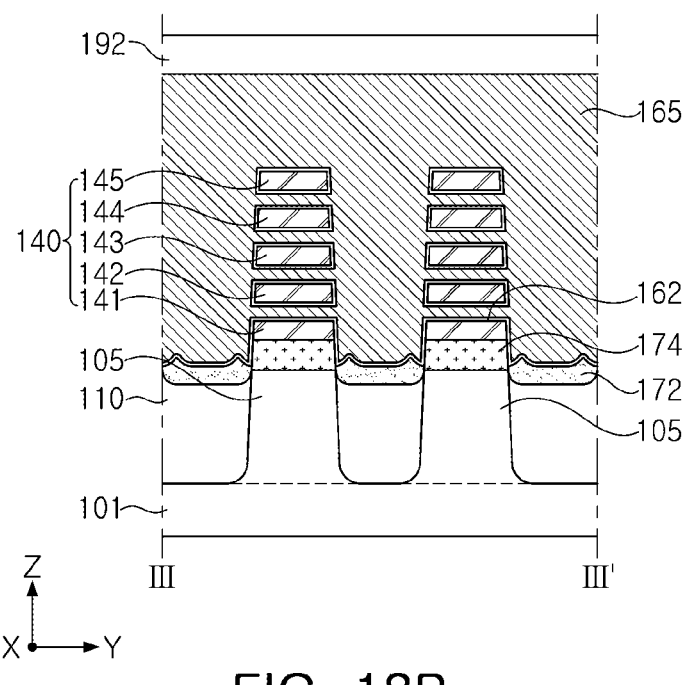

Referring to FIGS. 18A and 18B, gate structures 160 may be formed. The gate structures 160 may be formed to fill the upper gap regions UR and the second lower gap regions LR2.

In detail, the gate dielectric layers 162 may be formed to conformally cover inner surfaces of the upper gap regions UR and inner surfaces of the second lower gap regions LR2. The gate electrodes 165 may be formed to completely fill the upper gap regions UR and the second lower gap regions LR2, and a portion of the gate electrodes 165 may be removed in the upper gap regions UR, together with a portion of the gate dielectric layers 162 and a portion of the gate spacer layers 164, by a predetermined depth from an upper portion. Thereby, the gate structures 160 including the gate dielectric layer 162, the gate electrode 165, and the gate spacer layers 164 may be formed. Next, the first interlayer insulating layer 192 may be additionally formed on the gate structures 160.

Figure 19A:
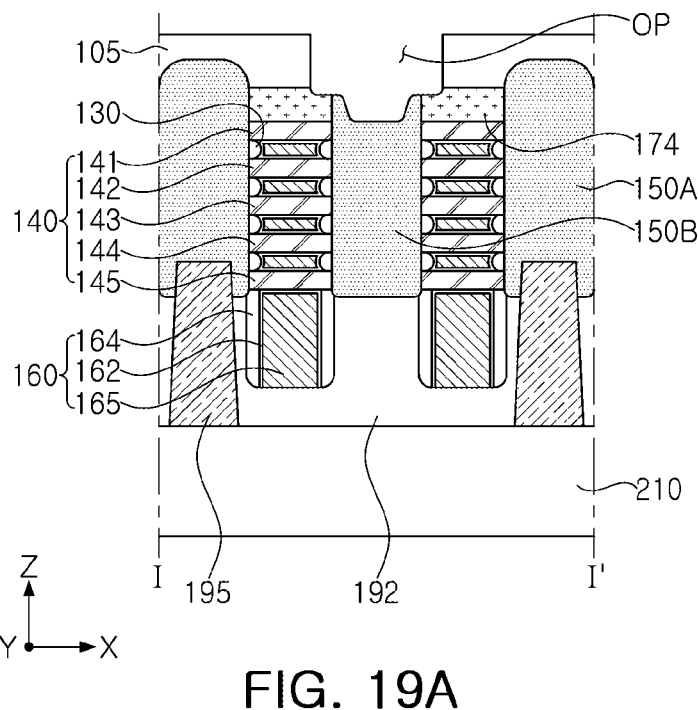
Figure 19B:
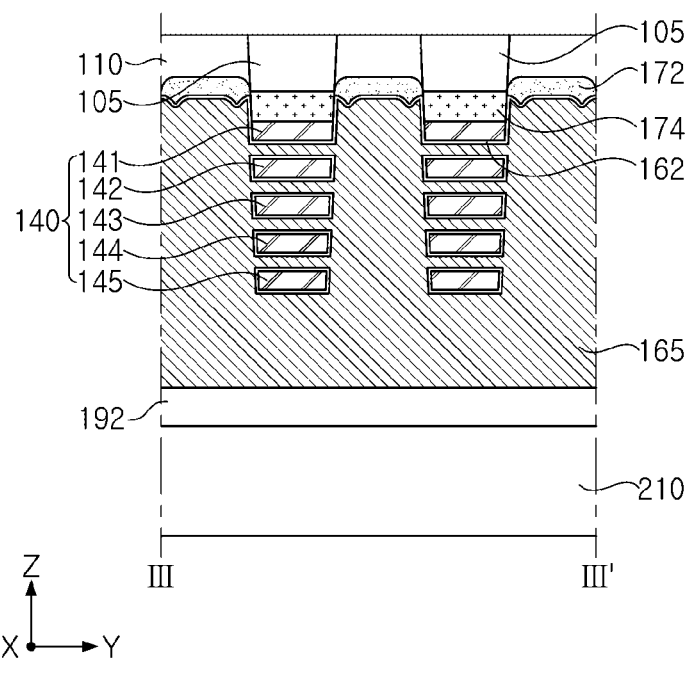

Referring to FIGS. 19A and 19B, the contact plugs 195 may be formed, a carrier substrate 210 may be bonded thereto, and an opening OP may be formed.

First, the first interlayer insulating layer 192 may be patterned to form contact holes exposing the first and second source/drain regions 150A and 150B. Next, the contact plugs 195 may be formed by filling the contact holes with a conductive material. Specifically, after a material forming a barrier layer is deposited in the contact holes, a silicide process may be performed to form a metal-semiconductor compound layer, e.g., a silicide layer on a lower end. Next, by depositing a conductive material to fill the contact holes, the contact plugs 195 may be formed. Interconnection structures connected to the contact plugs 195 may be further formed on the contact plugs 195.

Next, the entire structure manufactured above may be flip-bonded to the carrier substrate 210. Therefore, the entire structure may be turned upside down to expose the substrate 101 in an upward direction.

Next, the substrate 101 and a portion of the active regions 105 may be removed by a predetermined thickness from upper surfaces thereof, and the opening OP exposing the second source/drain region 150B may be formed. In this case, the device isolation layer 110 may also be partially removed from an upper surface thereof. In embodiments, thicknesses from which the substrate 101 and the portion of the active regions 105 are removed may be variously changed. For example, the active regions 105 may not be removed in some embodiments.

The opening OP may be formed to expose the second source/drain region 150B. The opening OP may be formed by selectively removing the active regions 105 and the second source/drain region 150B with respect to the first and second protective layers 172 and 174. The first and second protective layers 172 and 174 may also be partially removed depending on an etch rate. Even in this case, a thickness from which the first and second protective layers 172 and 174 are respectively removed may be thinner than a thickness from which the second source/drain region 150B is removed. In embodiments, a depth to which the second source/drain region 150B is recessed may be variously changed.

Figure 20A:
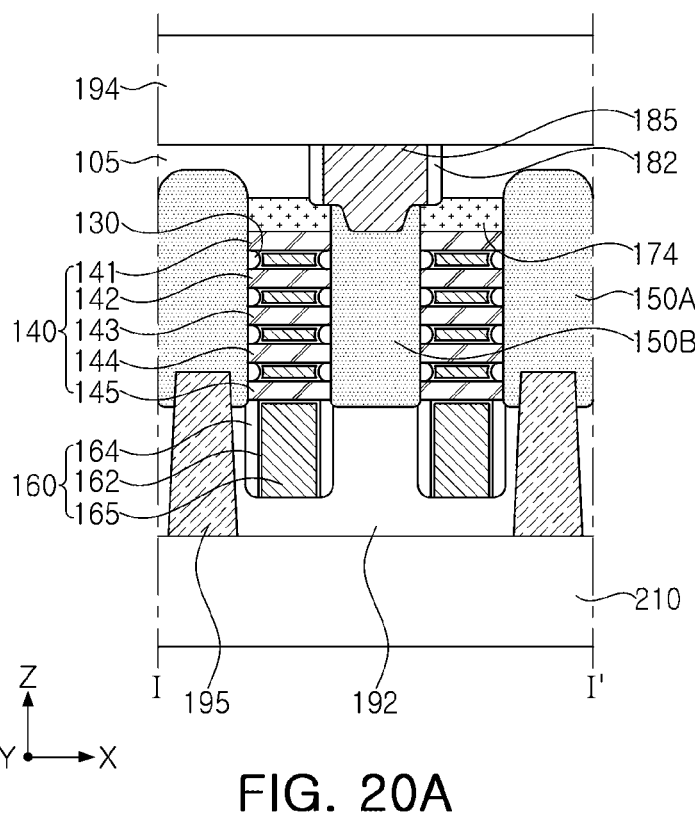
Figure 20B:
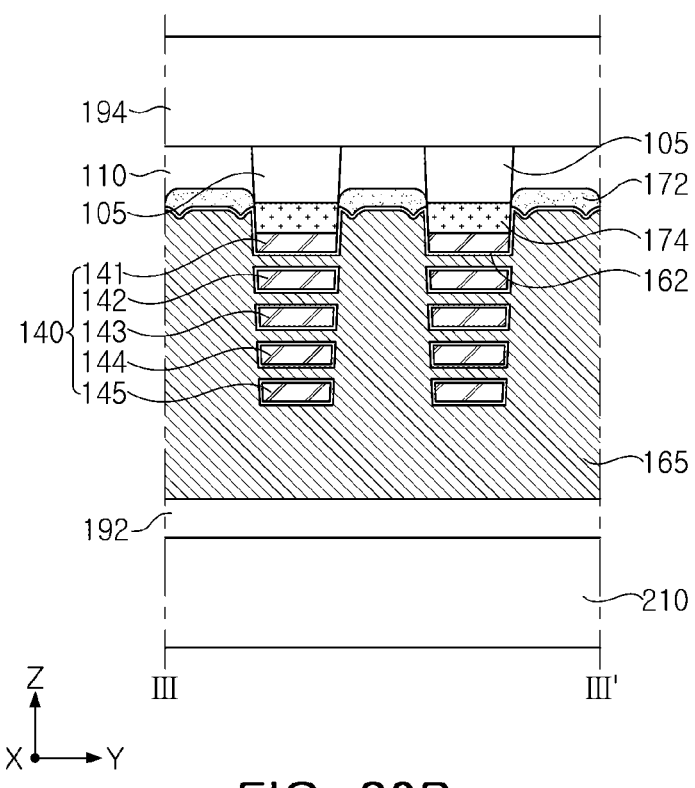

Referring to FIGS. 20A and 20B, the interconnection spacer layers 182 and the buried interconnection line 185 may be formed in the opening OP.

First, the interconnection spacer layers 182 may be formed on both sidewalls of the opening OP, and then a conductive material may be deposited and planarized to form the buried interconnection line 185. An upper surface of the buried interconnection line 185 may be coplanar with an upper surface of the active regions 105 and an upper surface of the device isolation layer 110. Next, the second interlayer insulating layer 194 may be formed on the buried interconnection line 185.

Next, referring to FIGS. 2A to 2C together, the second interlayer insulating layer 194 may be patterned, the lower interconnection layer 187 may be formed, and the carrier substrate 210 may be removed. An interconnection structure may be further formed on the lower interconnection layer 187. Therefore, the semiconductor device 100 of FIGS. 2A to 2C may be manufactured. The semiconductor device 100 may be packaged in a state in which the buried interconnection line 185 is located, e.g., positioned, in an upward direction, as illustrated in FIGS. 20A and 20B.

By way of summation and review, an aspect of embodiments provides a semiconductor device exhibiting an improved degree of integration and improved electrical characteristics. That is, by disposing a buried interconnection line to be self-aligned to a source/drain region by protective layers, a semiconductor device exhibiting an improved degree of integration and improved electrical characteristics may be provided. The buried interconnection line structure is self-aligned in source/drain regions while being disposed below the source/drain regions, with first protective layers between a device isolation layer and lower surfaces of gate structures, and with second protective layers between the device isolation layer and lower surfaces of channel structures. Accordingly, the first and second protective layers are alternately arranged below a gate electrode in a direction in which the gate electrode extends, and the buried interconnection line may be stably connected to the source/drain regions without being electrically shorted by the gate electrodes and the channel structures.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region extending in a first direction;
a device isolation layer on side surfaces of the active region and defining the active region;
gate structures on the active region and intersecting the active region, the gate structures extending in a second direction;
channel layers on the active region and spaced apart from each other in a third direction, the third direction being perpendicular to an upper surface of the active region, and the gate structures surrounding the channel layers;
source/drain regions in recessed regions of the active region, the source/drain regions being on opposite sides of each of the gate structures, and the source/drain regions being connected to the channel layers;
first protective layers on the device isolation layer, the first protective layers being on lower surfaces of the gate structures;
second protective layers on the active region and below lowermost ones of the channel layers, wherein the second protective layers fill a space between the lowermost ones of the channel layers active region; and
a buried interconnection line below the source/drain regions and connected to one of the source/drain regions between adjacent ones of the second protective layers.

2. The semiconductor device as claimed in claim 1, wherein the first protective layers and the second protective layers are alternately arranged on the lower surfaces of the gate structures in the second direction.

3. The semiconductor device as claimed in claim 2, wherein the first protective layers are located at a lower level than the second protective layers.

4. The semiconductor device as claimed in claim 1, wherein:
a first portion of an upper surface of the buried interconnection line is at a first height level, the first portion being at opposite edges of the buried interconnection line in the first direction, and
a second portion of the upper surface of the buried interconnection line is at a second height level, the second portion being at a center of the buried interconnection line between the opposite edges, and the second height level being higher than the first height level.

5. The semiconductor device as claimed in claim 1, wherein an upper surface of the buried interconnection line is curved along the first protective layers and the second protective layers.

6. The semiconductor device as claimed in claim 1, wherein the first protective layers are surrounded by the device isolation layer and the gate structures.

7. The semiconductor device as claimed in claim 6, wherein:
each of the gate structures includes gate dielectric layers contacting the active region and the channel layers, a gate electrode on the gate dielectric layers, and gate spacer layers on opposite sides of the gate electrode on the channel layers, and
the first protective layers are in contact with one of the gate dielectric layers.

8. The semiconductor device as claimed in claim 1, wherein:
each of the first protective layers has a first width in the first direction, and
each of the gate structures has a second width in the first direction, the second width being equal to or smaller than the first width.

9. The semiconductor device as claimed in claim 1, wherein the first protective layers overlap the gate structures in the third direction.

10. The semiconductor device as claimed in claim 1, wherein a thickness of each of the first protective layers is about 5 nm to about 100 nm.

11. The semiconductor device as claimed in claim 1, wherein the second protective layers overlap the channel layers in the third direction.

12. The semiconductor device as claimed in claim 1, further comprising interconnection spacer layers on opposite side surfaces of the buried interconnection line in the first direction.

13. The semiconductor device as claimed in claim 12, wherein upper surfaces of the interconnection spacer layers are in contact with the first protective layers and the second protective layers.

14. The semiconductor device as claimed in claim 1, wherein the first protective layers and the second protective layers include different materials.

15. A semiconductor device, comprising:

at least one active region extending in a first direction;

a device isolation layer on side surfaces of the at least one active region and defining the at least one active region;

a gate structure on the at least one active region and intersecting the at least one active region, the gate structure extending in a second direction;

source/drain regions in recessed regions of the at least one active region, the source/drain regions being on opposite sides of the gate structure;

first protective layers between the device isolation layer and the gate structure; and a buried interconnection line below the source/drain regions and connected to one of the source/drain regions through an upper surface of the buried interconnection line, wherein the first protective lavers overlap the e structure in a third direction, the third direction being perpendicular to an upper surface of the at least one active region.

16. The semiconductor device as claimed in claim 15, wherein the first protective layers do not extend onto the at least one active region, and first protective layers entirely overlap the device isolation layer in the third direction.

17. The semiconductor device as claimed in claim 15, wherein:

the at least one active region includes a plurality of active regions spaced apart from each other in the second direction, and the first protective layers are between adjacent ones of the plurality of active regions in the second direction.

18. The semiconductor device as claimed in claim 15, further comprising a second protective layer between the at least one active region and the gate structure.

19. A semiconductor device, comprising:

an active region extending in a first direction;

a device isolation layer on side surfaces of the active region and defining the active region;

gate structures on the active region and intersecting the active region, the gate structures extending in a second direction and being spaced apart from each other in the first direction;

source/drain regions in recessed regions of the active region, the source/drain regions being on opposite sides of the gate structures;

protective layers between the device isolation layer and the gate structures; and a buried interconnection line below the source/drain regions and connected to one of the source/drain regions between adjacent ones of the protective layers, the buried interconnection line contacting at least one of the protective layers.

20. The semiconductor device as claimed in claim 19, wherein both end portions of the protective layers in the second direction are on the device isolation layer.

* * * * *